(12) United States Patent
Nakashiba et al.

(10) Patent No.: US 8,772,914 B2
(45) Date of Patent: Jul. 8, 2014

(54) SEMICONDUCTOR DEVICE

(71) Applicant: Renesas Electronics Corporation, Kanagawa (JP)

(72) Inventors: Yasutaka Nakashiba, Kanagawa (JP); Kenta Ogawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/741,879

(22) Filed: Jan. 15, 2013

(65) Prior Publication Data

US 2013/0127033 A1 May 23, 2013

Related U.S. Application Data

(62) Division of application No. 12/874,246, filed on Sep. 2, 2010, now Pat. No. 8,378,470.

(30) Foreign Application Priority Data

Sep. 2, 2009 (JP) .................................. 2009-203040

(51) Int. Cl.
*H01L 23/495* (2006.01)
*H01L 21/60* (2006.01)
*H01L 23/52* (2006.01)

(52) U.S. Cl.
USPC ............ 257/676; 257/E31.031; 257/E21.506; 257/E23.038; 257/E23.042; 257/E23.052; 257/E33.066; 257/686; 257/777; 257/685; 257/723; 257/728; 257/724; 257/668; 257/530; 257/531; 257/532; 257/536; 257/666; 257/698; 257/784; 257/786

(58) Field of Classification Search
USPC ........... 257/676, E23.038, E23.042, E23.052, 257/E33.066, 686, 777, 685, 723, 728, 724, 257/668, 698, 531, 532, 536, 666, 784, 257/786; 438/14.3, 106, 107, 118, 119, 438/124, 127, 975; 437/915, 924; 455/41.1
See application file for complete search history.

(56) References Cited

U.S. PATENT DOCUMENTS

| | | | |
|---|---|---|---|
| 5,422,615 A | 6/1995 | Shibagaki et al. | |
| 5,821,614 A | 10/1998 | Hashimoto et al. | |
| 7,327,020 B2 | 2/2008 | Kwon et al. | |

(Continued)

FOREIGN PATENT DOCUMENTS

| | | |
|---|---|---|
| JP | 7-221260 | 8/1995 |
| JP | 2004-186297 | 7/2004 |

(Continued)

OTHER PUBLICATIONS

Japanese Official Action—2009-203040—Mar. 4, 2014.

*Primary Examiner* — Alexander Oscar Williams
(74) *Attorney, Agent, or Firm* — Young & Thompson

(57) ABSTRACT

A first semiconductor chip and a second semiconductor chip are overlapped with each other in a direction in which a first multilayer interconnect layer and a second multilayer interconnect layer are opposed to each other. When seen in a plan view, a first inductor and a second inductor are overlapped. The first semiconductor chip and the second semiconductor chip have non-opposed areas which are not opposed to each other. The first multilayer interconnect layer has a first external connection terminal in the non-opposed area, and the second multilayer interconnect layer has a second external connection terminal in the non-opposed area.

20 Claims, 25 Drawing Sheets

(56) References Cited

U.S. PATENT DOCUMENTS

| | | |
|---|---|---|
| 7,352,058 B2 | 4/2008 | Wallace |
| 7,906,852 B2 | 3/2011 | Nishimura et al. |
| 8,148,806 B2 | 4/2012 | Lin et al. |
| 8,378,470 B2 * | 2/2013 | Nakashiba et al. ............ 257/676 |
| 8,432,033 B2 * | 4/2013 | Shinohara ..................... 257/737 |
| 8,642,383 B2 | 2/2014 | Ha et al. |
| 2003/0038366 A1 | 2/2003 | Kozono |
| 2004/0262645 A1 | 12/2004 | Huff et al. |
| 2007/0096160 A1 | 5/2007 | Beroz et al. |
| 2007/0096284 A1 | 5/2007 | Wallace |
| 2008/0139013 A1 | 6/2008 | Tomura et al. |
| 2008/0178463 A1 | 7/2008 | Okubora |
| 2009/0230541 A1 | 9/2009 | Araki et al. |
| 2011/0089546 A1 * | 4/2011 | Bayan ........................... 257/676 |
| 2011/0143662 A1 | 6/2011 | Nakashiba et al. |
| 2012/0023730 A1 | 2/2012 | Chong et al. |
| 2012/0038445 A1 | 2/2012 | Finn |
| 2012/0112365 A1 | 5/2012 | Ausserlechner et al. |
| 2012/0119343 A1 | 5/2012 | Bayan et al. |
| 2013/0130442 A1 * | 5/2013 | Nakashiba et al. ........... 438/109 |

FOREIGN PATENT DOCUMENTS

| | | |
|---|---|---|
| JP | 2006-310649 | 11/2006 |
| JP | 2007-73600 | 3/2007 |
| JP | 2007-123650 | 5/2007 |
| JP | 2007-165459 | 6/2007 |
| JP | 2008-109121 | 5/2008 |
| JP | 2008-159607 | 7/2008 |
| JP | 2009-049035 | 3/2009 |
| JP | 2009-71253 | 4/2009 |

* cited by examiner

A—A'

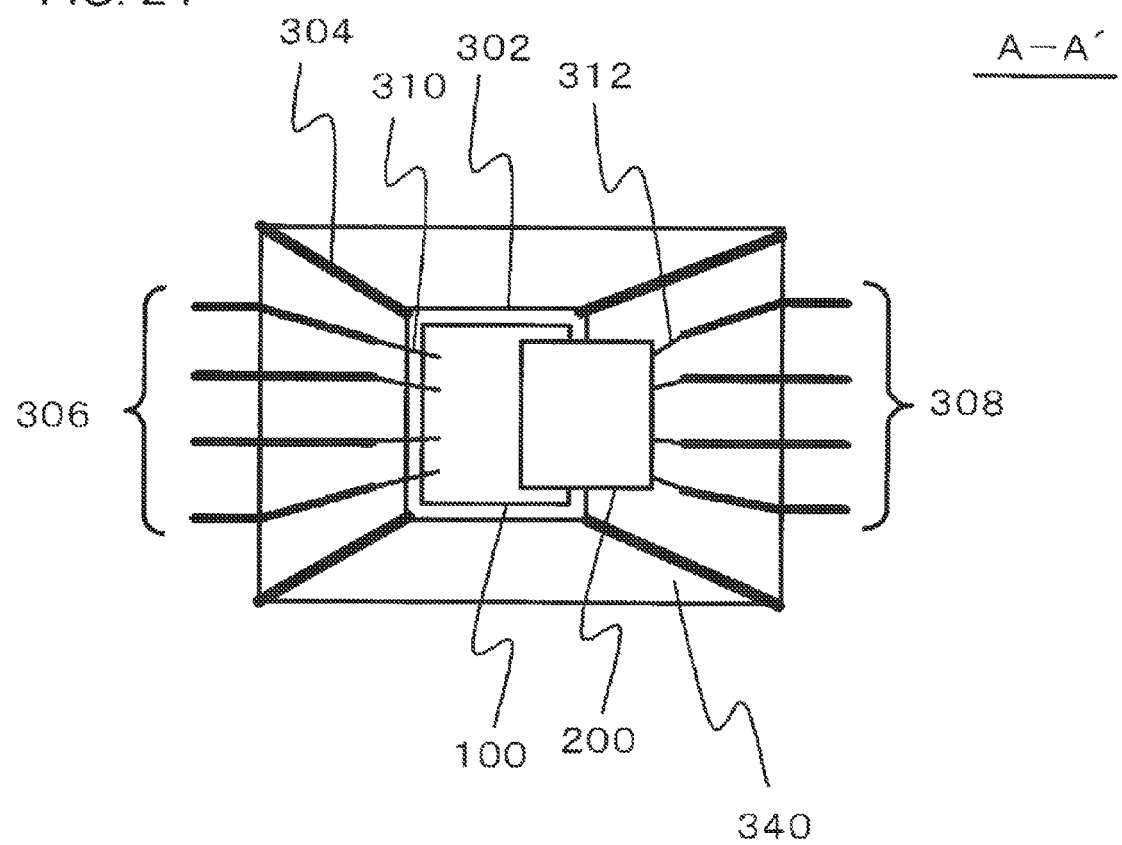

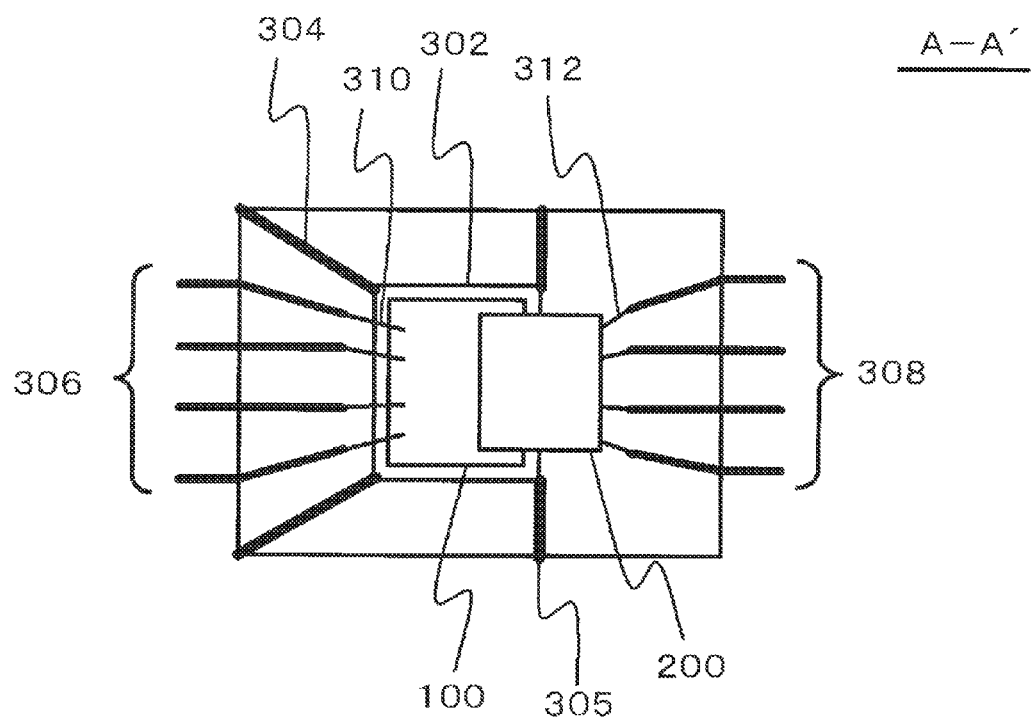

SEMICONDUCTOR DEVICE

This application is based on Japanese patent application No. 2009-203040, the content of which is incorporated hereinto by reference.

BACKGROUND

1. Technical Field

The present invention relates to a semiconductor device performing signal transmission between a first semiconductor chip and a second semiconductor chip using induction coupling of inductors, a method of manufacturing the semiconductor device, and a lead frame thereof.

2. Related Art

When signals are transmitted between two semiconductor chips which are not in contact, there are many cases of using a photo-coupler (e.g., Japanese Laid-open patent publication NO. 2004-186297). However, since the photo-coupler has a light emitting element and a light receiving element, it is difficult to reduce the photo-coupler in size. When a frequency of an electric signal is high, it is difficult to follow the electric signal.

Hereupon, recently, as described in Japanese Laid-open patent publication NOS. 2009-49035 and 2007-165459, a technique has been developed in which two inductors are provided between two semiconductor chips, and signals are transmitted and received between the inductors, thereby transmitting the signals between the two semiconductor chips which are not in contact.

In the technique described in Japanese Laid-open patent publication NO. 2009-49035, an insulating transformer formed by superposing a second semiconductor substrate having a second inductor over a first semiconductor substrate having a first inductor is provided between a first semiconductor chip and a second semiconductor chip. As for the insulating transformer, surfaces of the first semiconductor substrate and the second semiconductor substrate may be overlapped to each other in the opposed direction. One semiconductor substrate is provided with a through-hole for drawing out an interconnect connected to the inductor toward the rear side.

In the technique described in Japanese Laid-open patent publication NO. 2007-165459, a first inductor is formed in an interconnect layer of a first semiconductor chip, a second inductor is formed in an interconnect layer of a second semiconductor chip, and the inductors of the first semiconductor chip and the second semiconductor chip are overlapped to be opposed to each other.

In Japanese Laid-open patent publication NO. 2007-123650, it is disclosed that a first semiconductor chip having a first inductor and a second semiconductor chip having a second inductor are independently mounted over different lead frames, and the two semiconductor chips are opposed with a gap.

In order to raise a coupling coefficient between inductors, it is preferable that semiconductor chips or semiconductor substrates are overlapped in a direction in which interconnect layers are opposed to each other, thereby preventing the semiconductor substrate from being positioned between the inductors as described in Japanese Laid-open patent publication NOS. 2009-49035 and 2007-165459. However, with such a configuration, it is necessary to provide external connection terminals of the semiconductor device on the rear side of the substrate. In this case, for example, as described in Japanese Laid-open patent publication NO. 2004-186297, it is necessary to provide the semiconductor substrate with the through-hole. When the semiconductor substrate is provided with the through-hole, the manufacturing cost of the semiconductor device is increased.

In the technique described in Japanese Laid-open Patent publication NO. 2007-123650, it is necessary to broaden the gap between two semiconductor chips to connect a lead frame to the semiconductor chip by a wire. In this case, a coupling coefficient between the inductors becomes low.

As described above, it is difficult to raise the coupling coefficient between inductors while decreasing the manufacturing cost of the semiconductor device.

SUMMARY

In one embodiment, there is provided a semiconductor device including: a first semiconductor chip that includes a first multilayer interconnect layer and a first inductor formed in the first multilayer interconnect layer; and a second semiconductor chip that includes a second multilayer interconnect layer and a second inductor formed in the second multilayer interconnect layer, wherein the first semiconductor chip and the second semiconductor chip are overlapped with each other in a direction in which the first multilayer interconnect layer and the second multilayer interconnect layer are opposed to each other, the first inductor and the second inductor are overlapped when seen in a plan view, the first semiconductor chip and the second semiconductor chip include non-opposed areas which are not opposed to each other, the first multilayer interconnect layer includes a first external connection terminal in the non-opposed area, and the second multilayer interconnect layer includes a second external connection terminal in the non-opposed area.

According to the embodiment, the first semiconductor chip and the second semiconductor chip have the non-opposed areas which are not opposed to each other. The first multilayer interconnect layer has the first external connection terminal in the non-opposed area, and the second multilayer interconnect layer has the second external connection terminal in the non-opposed area. For this reason, the first semiconductor chip and the second semiconductor chip can be overlapped with each other, and a coupling coefficient of the first inductor and the second inductor can be raised. As for the first semiconductor chip and the second semiconductor chip, it is not necessary to provide external connection terminals on the rear sides of the substrates. For this reason, it is not necessary to form a through-hole even on any side of the substrate of the first semiconductor chip and the substrate of the second semiconductor chip, and it is possible to prevent the manufacturing cost of the semiconductor device from increasing.

In another embodiment, there is provided a method of manufacturing a semiconductor device including: face-up mounting a first semiconductor chip including a first multilayer interconnect layer, a first inductor formed in the first multilayer interconnect layer, and a first external connection terminal formed in the first multilayer interconnect layer, over a die pad of a first lead frame; and overlapping a second semiconductor chip including a second multilayer interconnect layer, a second inductor formed in the second multilayer interconnect layer, and a second external connection terminal formed in the second multilayer interconnect layer, over the first semiconductor chip in a direction in which the first multilayer interconnect layer and the second multilayer interconnect layer are opposed to each other, wherein in the step of overlapping of first semiconductor chip and the second semiconductor chip with each other, the first semiconductor chip and the second semiconductor chip are provided with areas which are not opposed to each other, and the first external connection terminal and the second external connection terminal are located in the areas.

In still another embodiment, there is provided a lead frame including:

a die pad; a first lead that extends outward from the vicinity of one side of the die pad; and a second lead that extends outward from the vicinity of the other side different from the one side of the die pad, wherein a distance from a leading end of the first lead to the die pad is different from a distance from a leading end of the second lead to the die pad.

According to the invention, in the semiconductor device performing the signal transmission between the first semiconductor chip and the second semiconductor chip using the induction coupling of the inductors, it is possible to prevent the manufacturing cost of the semiconductor device from increasing while raising the coupling coefficient of the inductors.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 24 is a plan view illustrating a configuration of a semiconductor device according to a comparative example; and FIG. 25 is a plan view illustrating a configuration of a semiconductor device according to a thirteenth embodiment.

DETAILED DESCRIPTION

Figure 1:
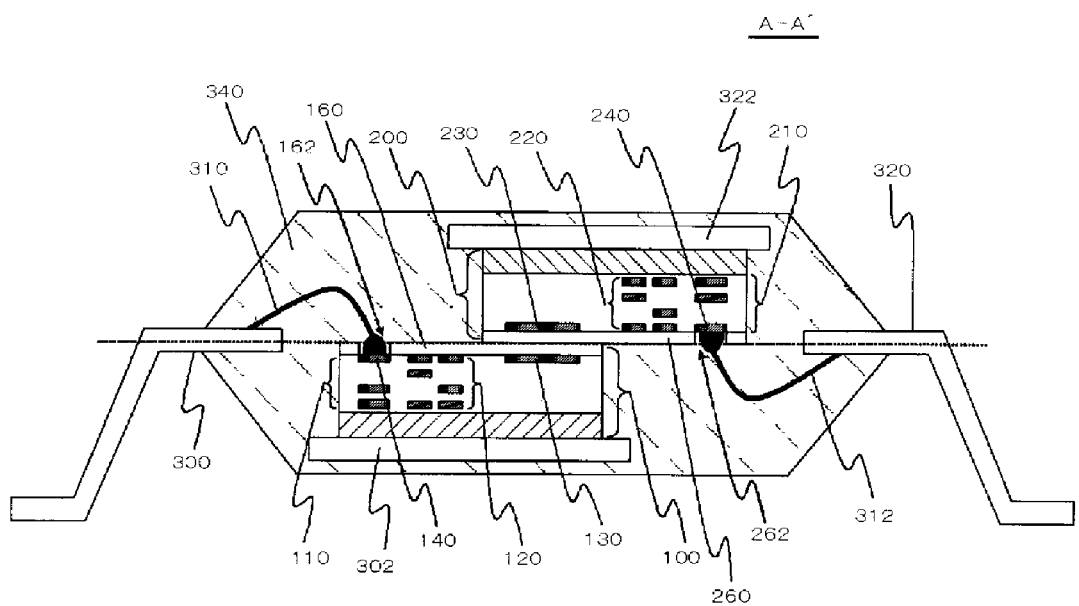
FIG. 1 is a cross-sectional view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the drawings. In the drawings, the same reference numerals and signs are given to the same constituent elements, and the description thereof will not be repeated.

FIG. 1 is a cross-sectional view illustrating a configuration of a semiconductor device according to a first embodiment. The semiconductor device has a first semiconductor chip 100 and a second semiconductor chip 200. The first semiconductor chip 100 has a first multilayer interconnect layer 110 and a first inductor 130. The first inductor 130 is formed in the first multilayer interconnect layer 110. The second semiconductor chip 200 has a second multilayer interconnect layer 210 and a second inductor 230. The second inductor 230 is formed in the second multilayer interconnect layer 210. The first semiconductor chip 100 and the second semiconductor chip 200 are overlapped in a direction in which the first multilayer interconnect layer 110 and the second multilayer interconnect layer 210 are opposed to each other. When seen in a plan view, the first inductor 130 and the second inductor 230 are overlapped. The first semiconductor chip 100 and the second semiconductor chip 200 have non-opposed areas which are not opposed to each other. The first multilayer interconnect layer 110 has a first external connection terminal 140 in the non-opposed area, and the second multilayer interconnect layer 210 has a second external connection terminal 240 in the non-opposed area. The first external connection terminal 140 and the second external connection terminal 240 are, for example, electrode pads formed over the top interconnect layer. In the embodiment, the first inductor 130 and the second inductor 230 are formed in the top interconnect layer.

In the embodiment, regarding a potential of an electric signal input to the first semiconductor chip 100 and a potential of an electric signal input to the second semiconductor chip 200, there are a case where amplitudes (difference between potential representing 0 and potential representing 1) of electric signals are different from each other, a case where referential potentials (potential representing 0) of electric signals are different, and a case where amplitudes of electric signals are different from each other and referential potentials of electric signals are different. For example, there is a case where an amplitude of an electric signal input to the first semiconductor chip 100 is 5 V, and a referential potential thereof is 0 V, an amplitude of an electric signal input to the second semiconductor chip 200 is 5 V, and a referential potential thereof is 100 V.

The first multilayer interconnect layer 110 of the first semiconductor chip 100 does not have an interconnect other than an interconnect connected to the first inductor 130 in an area overlapped with the second semiconductor chip 200 when seen in a plan view. An interconnect 120 for forming a circuit in the first semiconductor chip 100 is formed in the non-opposed area which is not opposed to the second semiconductor chip 200 when seen in a plan view.

The second multilayer interconnect layer 210 of the second semiconductor chip 200 does not have an interconnect other than an interconnect connected to the second inductor 230 in an area overlapped with the first semiconductor chip 100 when seen in a plan view. An interconnect 220 for forming a circuit in the second semiconductor chip 200 is formed in the non-opposed area which is not opposed to the first semiconductor chip 100 when seen in a plan view.

When a diameter of the first inductor 130 and the second inductor 230 is D and a distance from the first inductor 130 to the second inductor 230 is x, it is preferable to satisfy x≤D. For example, x is 20 μm, and D is 200 μm.

The first semiconductor chip 100 is mounted over a die pad 302 of a first lead frame 300, and the second semiconductor chip 200 is mounted over a die pad 322 of a second lead frame 320. The first lead frame 300 and the second lead frame 320 extend in directions different from each other (for example, directions reversed by) 180°. The first lead frame 300 and the first external connection terminal 140 are connected by a first bonding wire 310, and the second lead frame 320 and the second external connection terminal 240 are connected by a second bonding wire 312. The first semiconductor chip 100, the second semiconductor chip 200, the die pad 302 and an inner lead of the first lead frame 300, the die pad 322 and an inner lead of the second lead frame 320, and the bonding wires 310 and 312 are sealed by a sealing resin 340. Heights of the lead of the first lead frame 300 and the lead of the second lead frame 320 from the bottom of the first lead frame 300 are the same. In the drawings, since thicknesses of the first semiconductor chip 100 and the second semiconductor chip 200 are the same, the center positions in the height of the lead of the first lead frame 300 and the lead of the second lead frame 320 are located at the same height as the surface of the first semiconductor chip 100. In a case where the heights or areas of the first semiconductor chip 100 and the second semiconductor chip 200 are different or an example shown in FIGS. 20 to 22, the above description may not be applied.

The first semiconductor chip 100 has a first polyimide layer 160 located over the first multilayer interconnect layer 110, and the second semiconductor chip 200 has a second polyimide layer 260 located over the second multilayer interconnect layer 210. The first polyimide layer 160 is provided with an opening 162 located over the first external connection terminal 140, and the second polyimide layer 260 is provided with an opening 262 located over the second external connection terminal 240.

Figure 2:
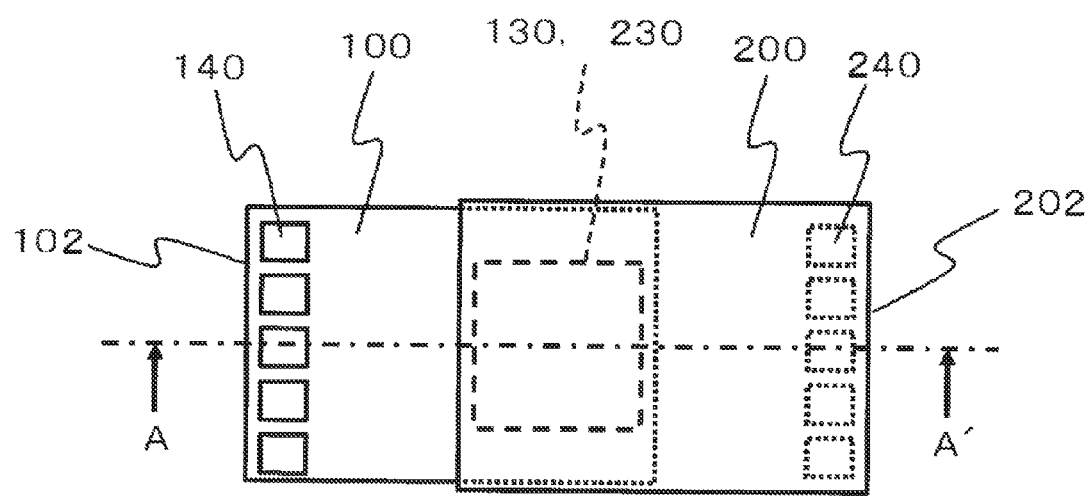
FIG. 2 is a plan view of the semiconductor device shown in FIG. 1.

FIG. 2 is a plan view of the semiconductor device shown in FIG. 1. FIG. 1 corresponds to a cross-sectional view taken along the line A-A' of FIG. 2. The first semiconductor chip 100 and the second semiconductor chip 200 are rectangular. The first semiconductor chip 100 has the first external connection terminal 140 in the vicinity of a first side 102. The second semiconductor chip 200 has the second external connection terminal 240 in the vicinity of a second side 202 located on the side opposite to the first side 102 when seen in a plan view.

The bonding wires 310 and 312 shown in FIG. 1 extend in a direction crossing to the first side 102 and the second side 202 (for example, an obliquely crossing direction). When seen in a plan view, the first semiconductor chip 100 and the second semiconductor chip 200 deviate from each other in a direction crossing to the first side 102.

It is preferable that a dimension $S_c$ of the area in which the first semiconductor chip 100 and the second semiconductor chip 200 are overlapped is smaller than a dimension of the area, which is not overlapped with the second semiconductor chip 200, of the first semiconductor chip 100, and is smaller than a dimension of the area, which is not overlapped with the first semiconductor chip 100, of the second semiconductor chip 200. In this case, since the dimension $S_c$ is less than a half of the dimension of the first semiconductor chip 100 and is less than a half of the dimension of the second semiconductor chip 200, insulating reliability becomes high.

Figure 3:
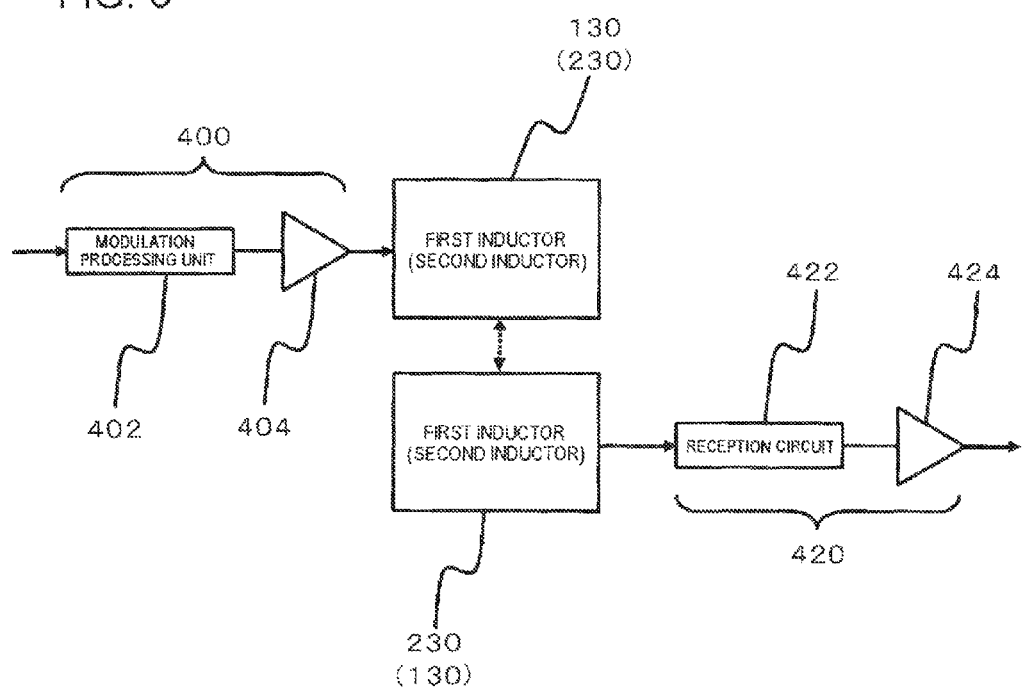
FIG. 3 is an equivalent circuit diagram of the semiconductor device shown in FIG. 1.

FIG. 3 is an equivalent circuit diagram of the semiconductor device shown in FIG. 1. As for this figure, the semiconductor device shown in FIG. 1 has a transmission circuit 400 and a reception side circuit 420. The transmission circuit 400 is formed on one side of the first semiconductor chip 100 and the second semiconductor chip 200, and the reception side circuit 420 is formed on the other side of the first semiconductor chip 100 and the second semiconductor chip 200. The transmission circuit 400 includes a modulation processing unit 402 that modulates a digital signal into a signal for transmission, and a transmission side driver circuit 404 (for example, gate driver) that outputs the modulated signal to the first inductor 130 or the second inductor 230. The reception side circuit 420 includes a reception circuit 422 connected to the second inductor 210 or the first inductor 130, and a reception side driver circuit 424 (for example, gate driver). The reception circuit 422 demodulates the modulated signal into a digital signal. The digital signal demodulated by the reception circuit 422 is output to the reception side driver circuit 424. The transmission circuit 400 and the reception side circuit 420 include transistors formed over the substrate.

As described above, in the transmission circuit 400 and the reception side circuit 420, potentials of input electric signals are different from each other, but the first inductor 130 and the second inductor 230 have no problem in the transmission circuit 400 and the reception side circuit 420 for transmitting and receiving electric signals using induction coupling.

Figure 4:
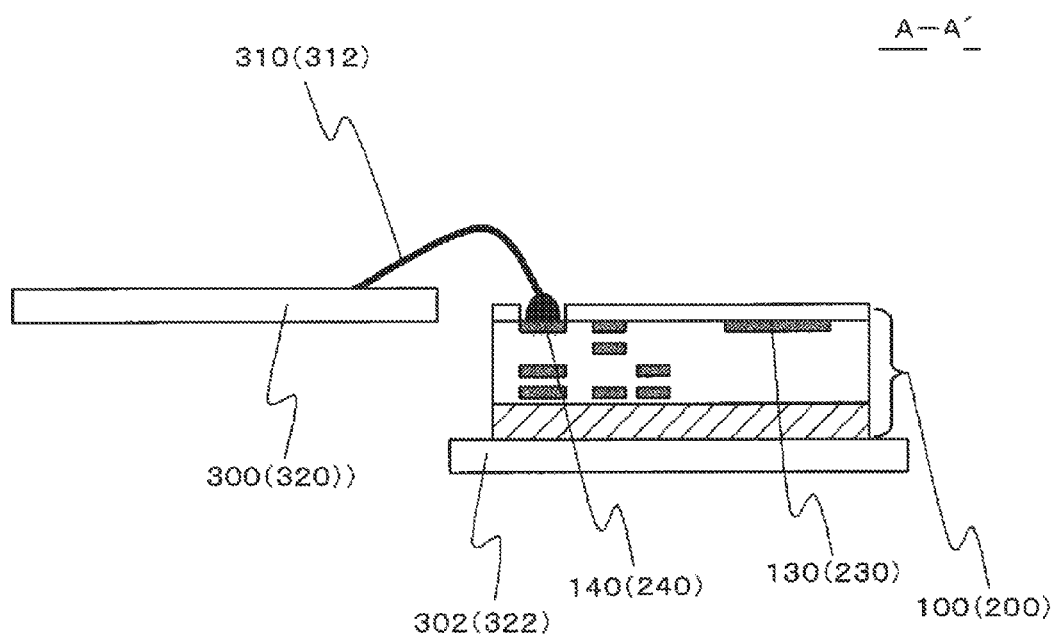
FIG. 4 is a cross-sectional view illustrating a method of manufacturing the semiconductor device shown in FIG. 1.

Next, a method of manufacturing the semiconductor device shown in FIG. 1 will be described with reference to the cross-sectional views of FIG. 4 and FIG. 5. First, as shown in FIG. 4, the first semiconductor chip 100 and the second semiconductor chip 200 are prepared. The first semiconductor chip 100 is fixed to the die pad 302 of the first lead frame 300 using silver paste or the like, and the second semiconductor chip 200 is fixed to the die pad 322 of the second lead frame 320 using silver paste or the like. Then, the first semiconductor chip 100 and the first lead frame 300 are connected to each other by the bonding wire 310, and the second semiconductor chip 200 and the second lead frame 320 are connected to each other by the bonding wire 312. The first semiconductor chip 100 is face-up mounted in the first lead frame 300, and the second semiconductor chip 200 is face-up mounted in the second lead frame 320.

Thereafter, at least a part of the connection portion of the first lead frame 300 and the bonding wire 310, the connection portion of the external connection terminal 140 of the first semiconductor chip 100 and the bonding wire 310, and the connection portion of the external connection terminal 240 of the second semiconductor chip 200 and the bonding wire 312 is potted by resin, thereby fixing the connection portions. Accordingly, it is possible to prevent the bonding wires 310 and 312 from deviating or being deformed against a superposition process and a sealing process to be described below. In addition, it is preferable that the potting resin is not taken in the area where the first semiconductor chip 100 and the second semiconductor chip 200 are overlapped when seen in a plan view.

Figure 5:
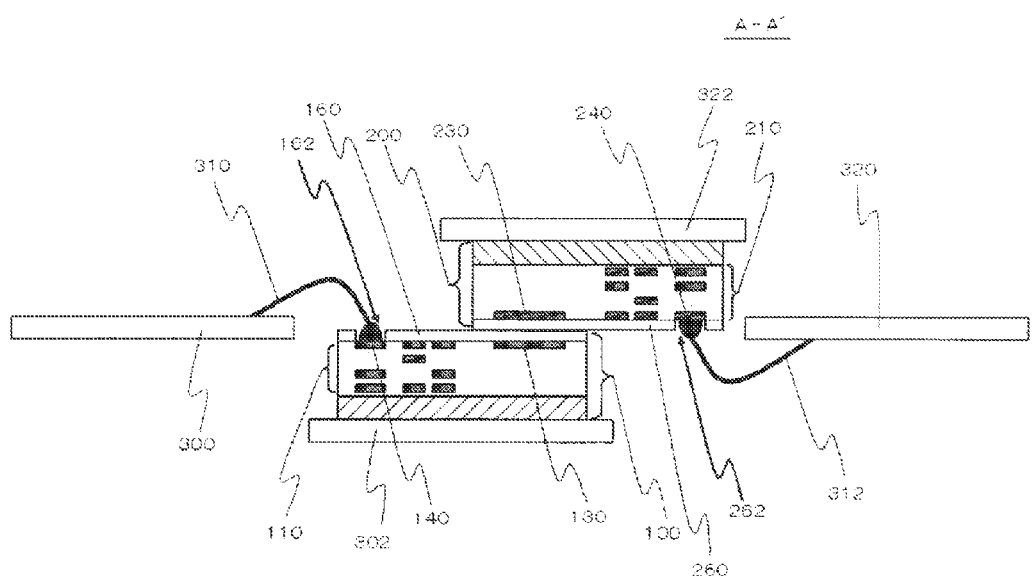
FIG. 5 is a cross-sectional view illustrating a method of manufacturing the semiconductor device shown in FIG. 1.

Then, as shown in FIG. 5, the first lead frame 300, on which the first semiconductor chip 100 is mounted, is mounted over a lower mold of a sealing mold (not shown). Then, the second lead frame 320, on which the second semiconductor chip 200 is mounted, is mounted over the first semiconductor chip 100 in a direction in which the first multilayer interconnect layer 110 and the second multilayer interconnect layer 210 are opposed to each other. At this time, the first semiconductor chip 100 and the second semiconductor chip 200 are provided with non-opposed areas which are not opposed to each other, and the first external connection terminal 140 and the second external connection terminal 240 are located in the non-opposed areas. In this state, the heights of the lead of the first lead frame 300 and the lead of the second lead frame 320 from the bottom of the first lead frame 300 are the same.

Then, an upper mold of the sealing mold is mounted over the lower mold. The fluid sealing resin 340 is poured into the sealing mold, and the sealing resin 340 is cured by heat. The semiconductor device shown in FIG. 1 is removed from the sealing mold. Then, the lead of the first lead frame 300 and the lead of the second lead frame 320 are cut in a predetermined length and are formed in a predetermined shape. This process is performed using the mold. In the state after the cutting and forming of the leads are performed, the first lead frame 300 and the second lead frame 320 are in a state of being insulated from each other.

Next, operations and advantages of the embodiment will be described. According to the embodiment, the first semiconductor chip 100 and the second semiconductor chip 200 have the non-opposed areas which are not opposed to each other. The first multilayer interconnect layer 110 has the first external connection terminal 140 in the non-opposed area, and the second multilayer interconnect layer 210 has the second external connection terminal 240 in the non-opposed area. For this reason, the first semiconductor chip 100 and the second semiconductor chip 200 can be overlapped, and the coupling coefficient of the first inductor 130 and the second inductor 230 can be raised. It is not necessary to provide an external connection terminal on the rear side of the substrate of the first semiconductor chip 100, and it is not necessary to provide an external connection terminal on the rear side of the substrate of the second semiconductor chip 200. Accordingly, it is not necessary to form a through-hole even on any side of the substrate of the first semiconductor chip 100 and the substrate of the second semiconductor chip 200, and it is possible to prevent a manufacturing cost of the semiconductor device from increasing.

The first multilayer interconnect layer 110 of the first semiconductor chip 100 does not have an interconnect other than an interconnect connected to the first inductor 130 in an area overlapped with the second semiconductor chip 200 when seen in a plan view. Accordingly, when signals are transmitted and received between the first inductor 130 and the second inductor 230, it is possible to prevent magnetism generated from the signal propagated along the interconnect included in the first multilayer interconnect layer 110, from being noise.

In the embodiment, the second multilayer interconnect layer 210 of the second semiconductor chip 200 also does not have an interconnect other than an interconnect connected to the second inductor 230 in an area overlapped with the first semiconductor chip 100 when seen in a plan view. Accordingly, when signals are transmitted and received between the first inductor 130 and the second inductor 230, it is possible to prevent magnetism generated from the signal propagated along the interconnect included in the second multilayer interconnect layer 210, from being noise.

In the embodiment, the first lead frame 300 and the second lead frame 320 extend in directions different from each other. Accordingly, the first lead frame 300 and the second lead frame 320 can be separated at a distance as compared with the case where the first lead frame 300 and the second lead frame 320 extend in the same direction, and it is possible to raise insulating reliability therebetween.

The first semiconductor chip 100 has a first polyimide layer 160, and the second semiconductor chip 200 has a second polyimide layer 260. For this reason, even when there is a great difference between a potential of an electric signal input to the first semiconductor chip 100 and a potential of an electric signal input to the second semiconductor chip 200, it is possible to secure pressure resistance of the first lead frame 300 and the second lead frame 320.

In the embodiment, the first semiconductor chip 100 has the first external connection terminal 140 in the vicinity of the first side 102, and the second semiconductor chip 200 has the second external connection terminal 240 in the vicinity of the second side 202. The second side 202 is located on the side opposite to the first side 102 when seen in a plan view. For this reason, it is possible to prevent the bonding wires 310 and 312 from interfering with each other.

When a diameter of the first inductor 130 and the second inductor 230 is D and a distance from the first inductor 130 to the second inductor 230 is x, it is preferable to satisfy x≤D. In such a case, the coupling coefficient of induction coupling of the first inductor 130 and the second inductor 230 is raised, and it is possible to prevent transmission error in transmission and reception between the first inductor 130 and the second inductor 230 from occurring.

Figure 6:
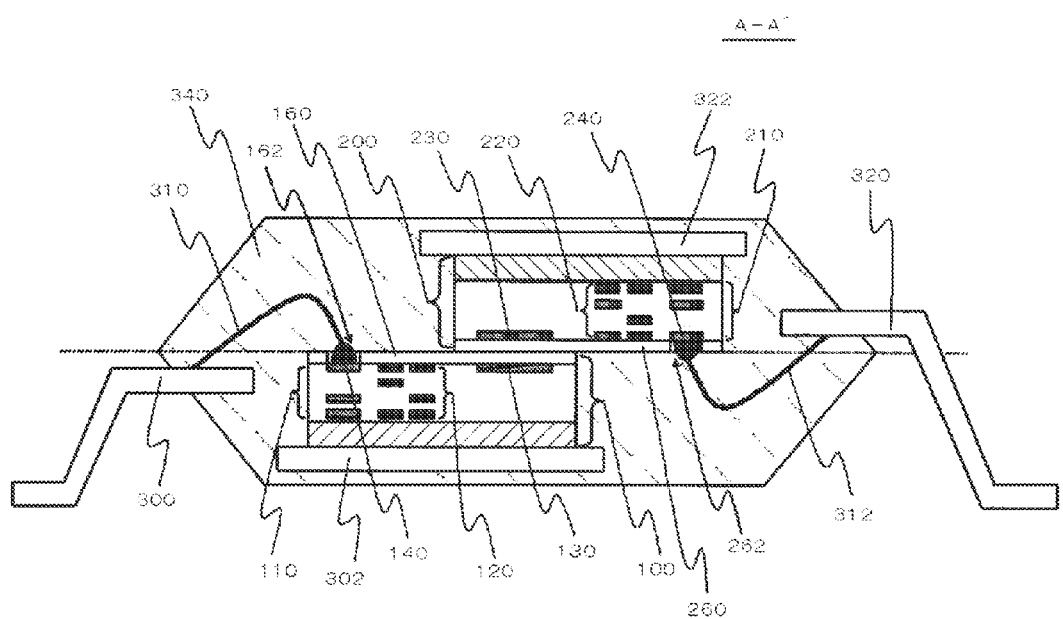
FIG. 6 is a cross-sectional view illustrating a modified example of the semiconductor device shown in FIG. 1.

In the embodiment, as shown in FIG. 6, there may be a difference in the heights of the first lead frame 300 and the second lead frame 320. In such a case, a distance between the lead portion of the first lead frame 300 and the lead portion of the second lead frame 320 on the side face of the semiconductor device can be made long, and the distance between the two lead portions on the interface with the sealing resin 340 can be made long. By such a long distance, it is possible to prevent insulation breakdown from occurring between the two lead portions.

Figure 7:
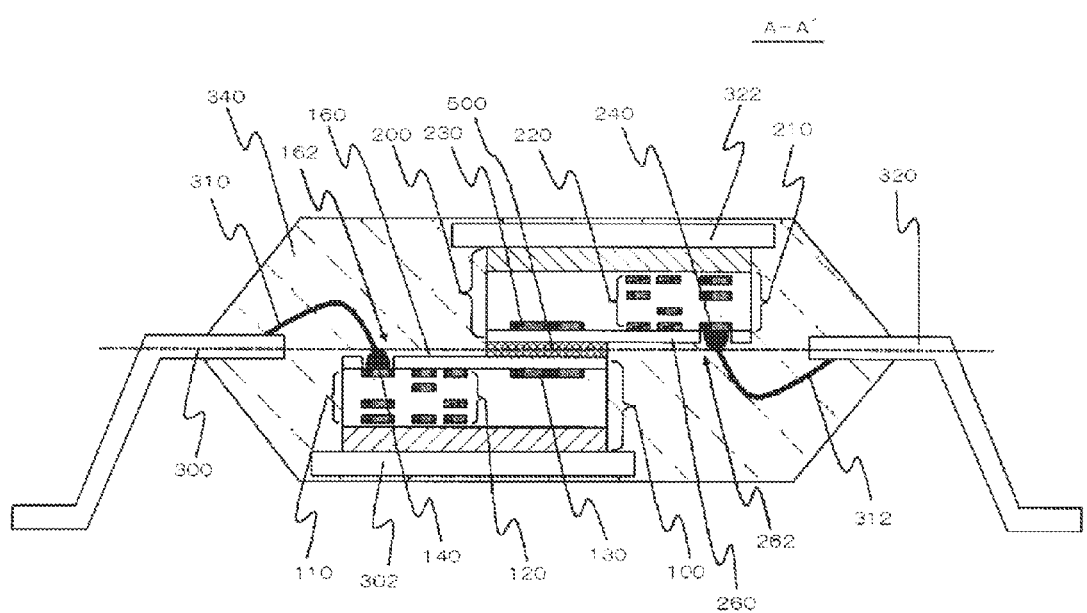
FIG. 7 is a cross-sectional view illustrating a configuration of a semiconductor device according to a second embodiment.

FIG. 7 is a cross-sectional view illustrating a configuration of a semiconductor device according to a second embodiment, and corresponds to FIG. 1 in the first embodiment. This semiconductor device has the same configuration of the semiconductor device according to the first embodiment, except that the first semiconductor chip 100 and the second semiconductor chip 200 are fixed to each other by an insulating adhesive layer 500.

The adhesive layer 500 is a film-shaped insulating adhesive sheet such as a die attach film (DAF). For example, a thickness of the adhesive layer 500 is equal to or more than 10 μm and equal to or less than 100 μm. When the insulating adhesive sheet is used as the adhesive layer 500, the insulating sheet may be thermosetting and thermoplastic. In the case of thermosetting, a main component of the adhesive layer 500 includes, for example, epoxy-based resin, acryl-based resin, or mixing resin thereof.

Figure 8:
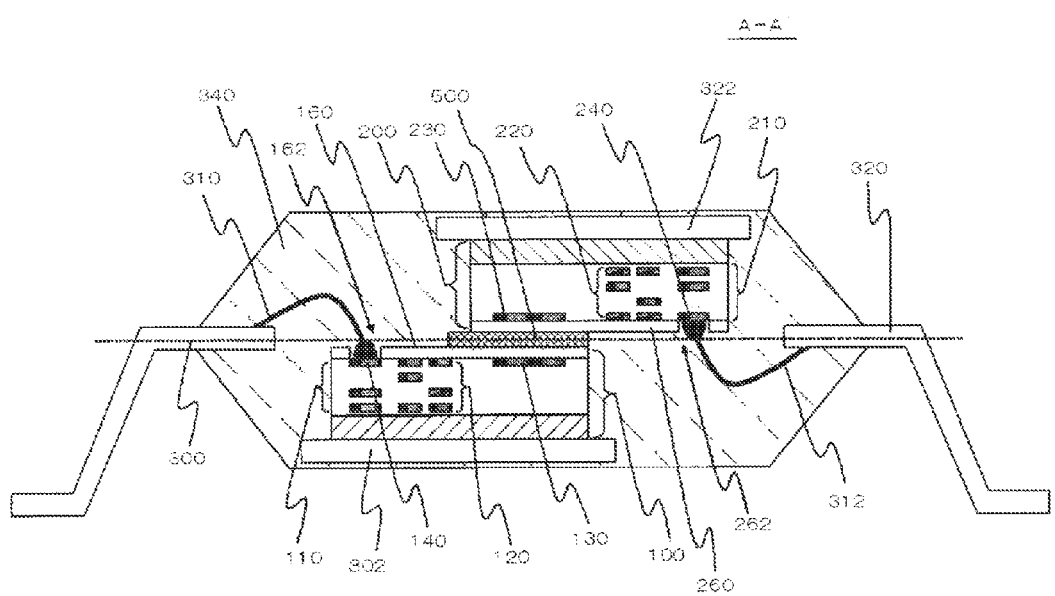
FIG. 8 is a cross-sectional view illustrating a modified example of the semiconductor device shown in FIG. 7.
Figure 9:
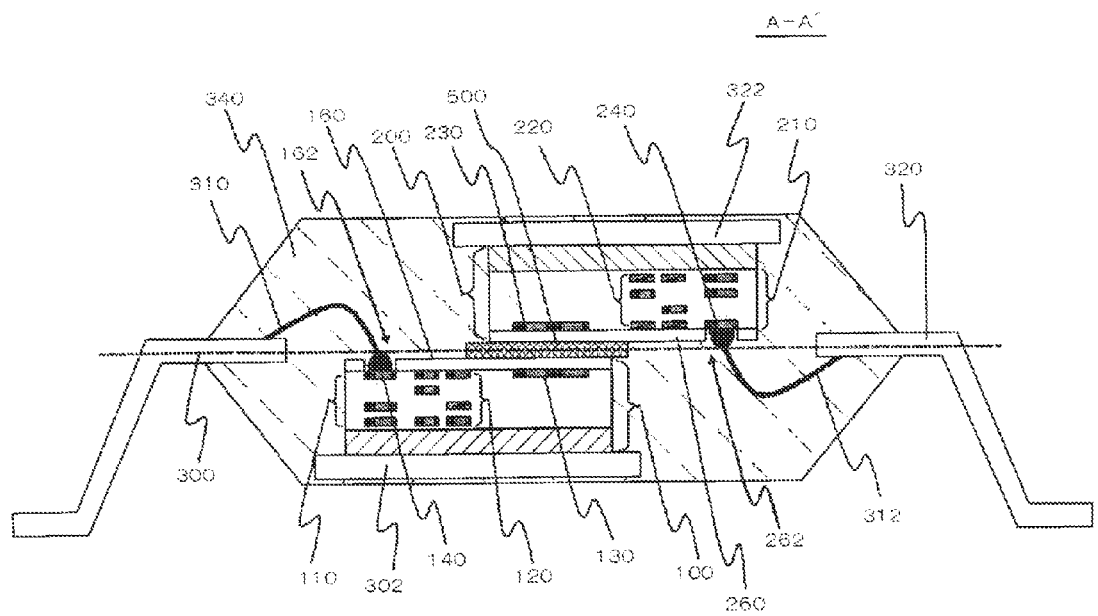
FIG. 9 is a cross-sectional view illustrating a modified example of the semiconductor device shown in FIG. 7.

The adhesive layer 500 is provided in at least an area where the first inductor 130 and the second inductor 230 are opposed when seen in a plan view. In the example shown in FIG. 7, the adhesive layer 500 is provided only in an area where the first semiconductor chip 100 and the second semiconductor chip 200 are opposed to each other. However, as shown in FIG. 8, the adhesive layer 500 may be provided even in the vicinity of an area opposed to one side, on one side (for example, first semiconductor chip 100) of the first semiconductor chip 100 and the second semiconductor chip 200. In addition, as shown in FIG. 9, the adhesive layer 500 may be even in the vicinity of an area opposed to one side, on both sides of the first semiconductor chip 100 and the second semiconductor chip 200.

The method of manufacturing the semiconductor device according to the embodiment is the same as the method of manufacturing the semiconductor device according to the first embodiment, except that the adhesive layer 500 is provided on at least one side of the first semiconductor chip 100 and the second semiconductor chip 200 before the second semiconductor chip 200 mounted over the second lead frame 320 is mounted over the first semiconductor chip 100. In the embodiment, when the second semiconductor chip 200 is overlapped with the first semiconductor chip 100, the first semiconductor chip 100 and the second semiconductor chip 200 are fixed to each other by the adhesive layer 500.

According to the embodiment, the same advantages as the first embodiment can be obtained. Since the first semiconductor chip 100 and the second semiconductor chip 200 are fixed to each other before the sealing resin 340 is poured into the mold, it is possible to prevent the position of the first semiconductor chip 100 and the second semiconductor chip 200 from deviating from each other when the sealing resin 340 is poured into the mold.

When the adhesive layer 500 is formed of the insulating adhesive sheet, it is possible to control the distance between the first inductor 130 and the second inductor 230 with high precision to be a desired value by changing the thickness of the insulating adhesive sheet. Since non-uniformity of the first inductor 130 and the second inductor 230 can be suppressed, it is possible to prevent the coupling coefficient of the first inductor 130 and the second inductor 230 from being dispersed.

When the adhesive layer 500 is not provided, the sealing resin 340 may be squeezed between the first semiconductor chip 100 and the second semiconductor chip 200. Mostly, a filler such as silica is introduced as the sealing resin 340. The coupling coefficient of the first inductor 130 and the second inductor 230 is changed according to the largeness or smallness of the amount of the filter squeezed between the first inductor 130 and the second inductor 230. On the contrary, when the adhesive layer 500 is formed of the insulating adhesive sheet, it is possible to prevent the sealing resin 340 from being squeezed between the first inductor 130 and the second inductor 230. Accordingly, it is possible to prevent the coupling coefficient of the first inductor 130 and the second inductor 230 from being dispersed.

As shown in FIG. 8 and FIG. 9, when the area where the adhesive layer 500 is provided is wider than the area where the first semiconductor chip 100 and the second semiconductor chip 200 are opposed to each other, and even when slight peeling-off occurs between the first semiconductor chip 100 or the second semiconductor chip 200 and the sealing resin 340, it is possible to position the adhesive layer 500 on the extension of propagation path of the peeling-off. Accordingly, it is possible to prevent the peeling-off from expanding.

Figure 10:
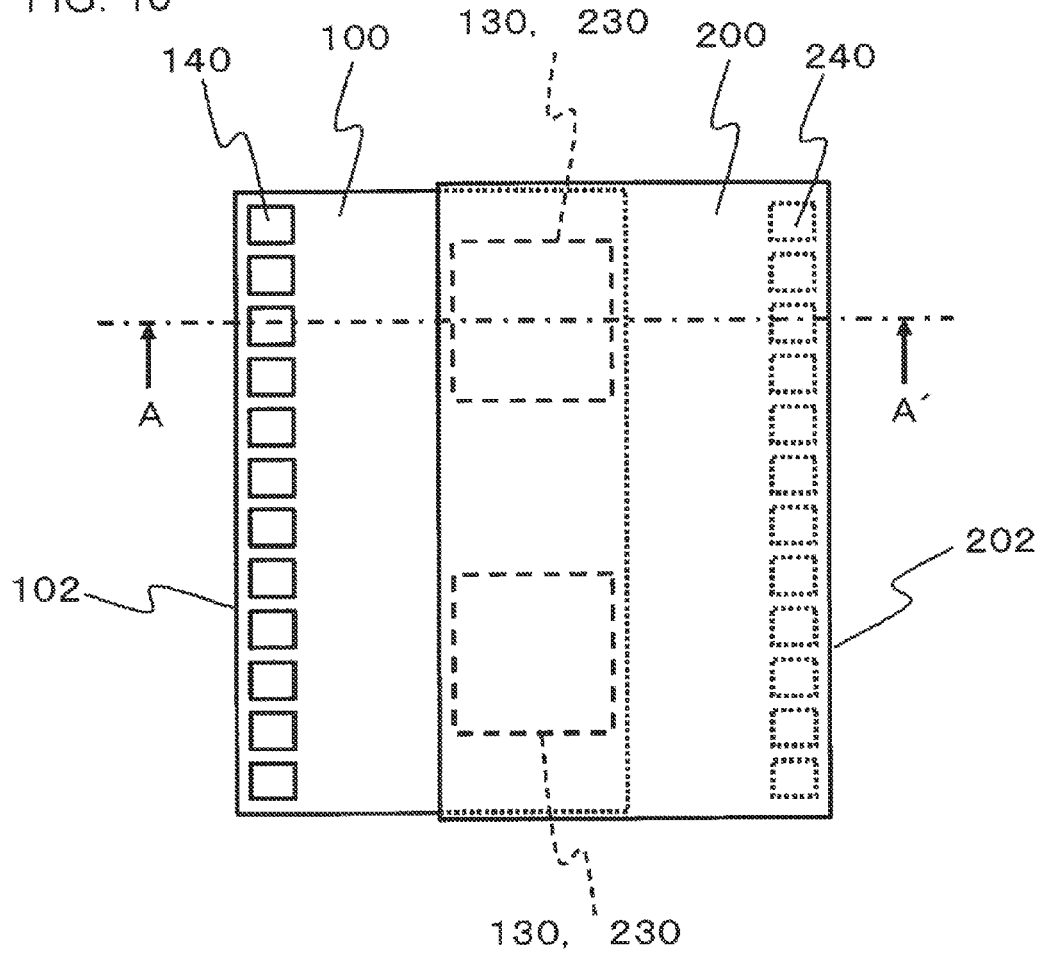
FIG. 10 is a plan view of a semiconductor device according to a third embodiment.

FIG. 10 is a plan view of a semiconductor device according to a third embodiment. FIG. 10 corresponds to FIG. 2 of the first embodiment. The semiconductor device according to the embodiment is the same as the semiconductor device according to the first or second embodiment, except that the first semiconductor chip 100 and the second semiconductor chip 200 perform interactive communication.

That is, in the embodiment, the first semiconductor chip 100 has two first inductors 130, and the second semiconductor chip 200 has two second inductors 230. The first semiconductor chip 100 has the transmission circuit 400 and the reception side circuit 420 shown in FIG. 3, and the second semiconductor chip 200 also has the transmission circuit 400 and the reception side circuit 402 shown in FIG. 3. One of the two first inductors 130 of the first semiconductor chip 100 is connected to the transmission circuit 400, and the other is connected to the reception side circuit 420. One of the two second inductors 230 of the second semiconductor chip 200 is connected to the transmission circuit 400, and the other is connected to the reception side circuit 420.

The first inductor 130 connected to the transmission circuit 400 is overlapped with the second inductor 230 connected to the reception side circuit 420 when seen in a plan view. The first inductor 130 connected to the reception side circuit 420 is overlapped with the second inductor 230 connected to the transmission circuit 400 when seen in a plan view.

According to the embodiment, the same advantages as the first or second embodiment can be obtained.

Figure 11:
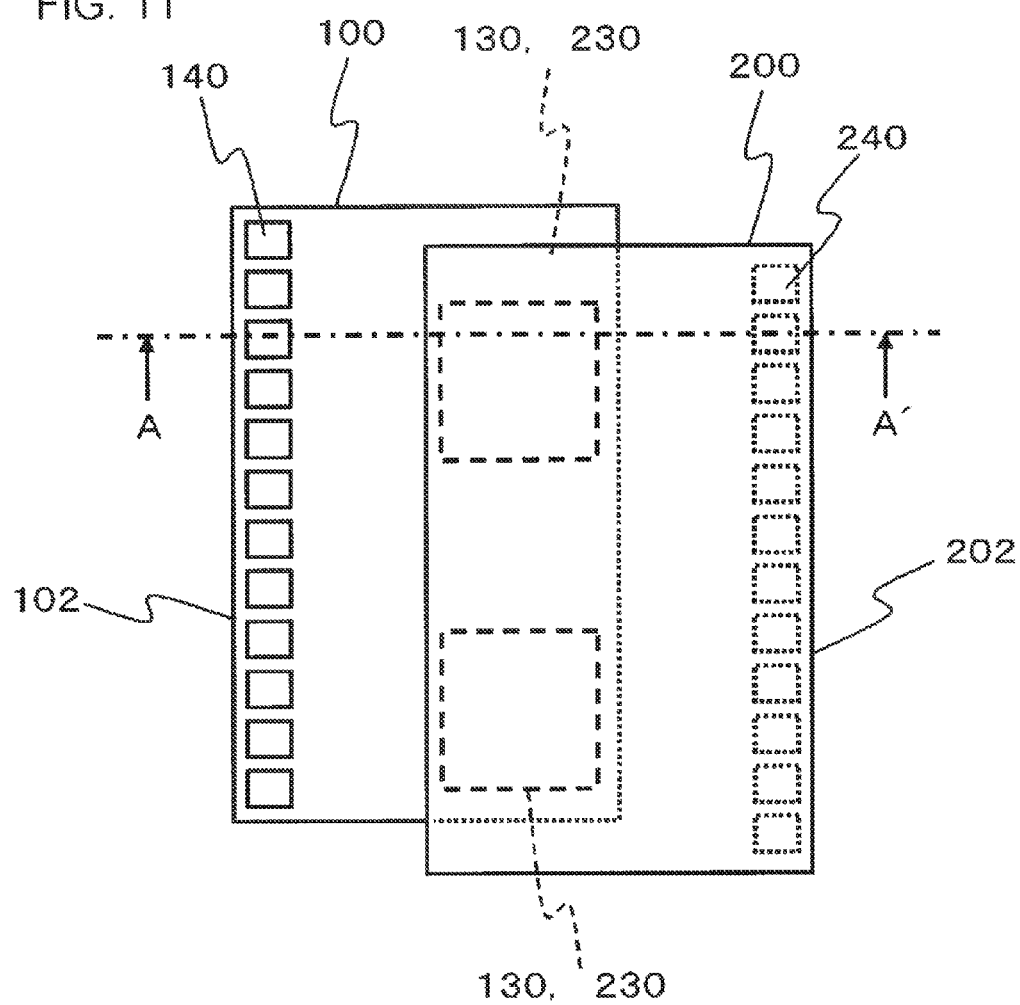
FIG. 11 is a plan view of a semiconductor device according to a forth embodiment.

FIG. 11 is a plan view of a semiconductor device according to a fourth embodiment, and corresponds to FIG. 10 of the third embodiment. The semiconductor device according to the embodiment has the same configuration as the semiconductor device according to the third embodiment, except that the first semiconductor device 100 and the second semiconductor device 200 obliquely deviate when seen in a plan view.

According to the embodiment, the same advantages as the first or second embodiment can be obtained.

Figure 12:
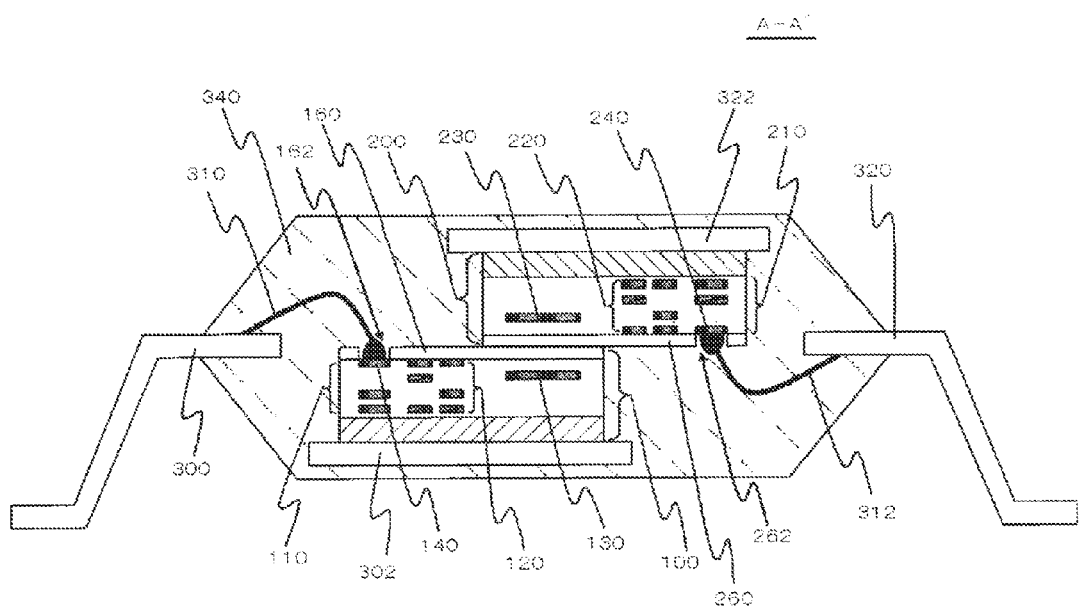
FIG. 12 is a cross-sectional view of a semiconductor device according to a fifth embodiment.

FIG. 12 is a cross-sectional view of a semiconductor device according to a fifth embodiment, and corresponds to FIG. 1 of the first embodiment. The semiconductor device according to the embodiment has the same configuration as the semiconductor device according to the first embodiment, except that the first inductor 130 is formed in an interconnect layer other than the top layer of the first multilayer interconnect layer 110, and the second inductor 230 is formed in an interconnect layer other than the top layer of the second multilayer interconnect layer 210. In the example shown in the figure, the first inductor 130 and the second inductor 230 are formed in the second-layer interconnect layer from the top, but may be formed in the one-layer-lower interconnect layer. The first inductor 130 and the second inductor 230 may not be formed in the same interconnect layer.

Accordingly to the embodiment, the same advantages as the first or second embodiment can be obtained. Since the distance between the first inductor 130 and the second inductor 230 can be made long, it is possible to raise pressure resistance between the first inductor 130 and the second inductor 230.

Figure 13:
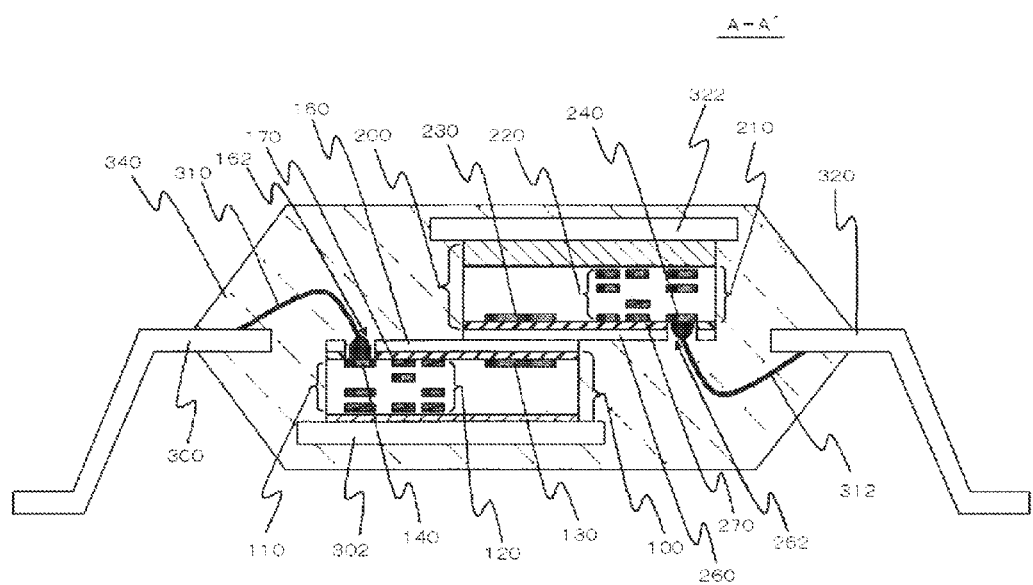
FIG. 13 is a cross-sectional view of a semiconductor device according to a sixth embodiment.

FIG. 13 is a cross-sectional view of a semiconductor device according to a sixth embodiment, and corresponds to FIG. 1 of the first embodiment. The semiconductor device according to the embodiment has the same configuration as the semiconductor device according to the first embodiment, except that the first semiconductor chip 100 has a first protective insulating film 170, and the second semiconductor chip 200 has a second protective insulating film 270. For example, the first protective insulating film 170 and the second protective insulating film 270 include at least one of silicon oxide and silicon nitride. The first protective insulating film 170 is provided between the first multilayer interconnect layer 110 and the first polyimide layer 160, and the second protective insulating film 270 is provided between the second multilayer interconnect layer 210 and the second polyimide layer 260.

According to the embodiment, the same advantages as the first or second embodiment can be obtained.

Since the distance between the first inductor 130 and the second inductor 230 can be made long, it is possible to raise pressure resistance between the first inductor 130 and the second inductor 230.

Figure 14:
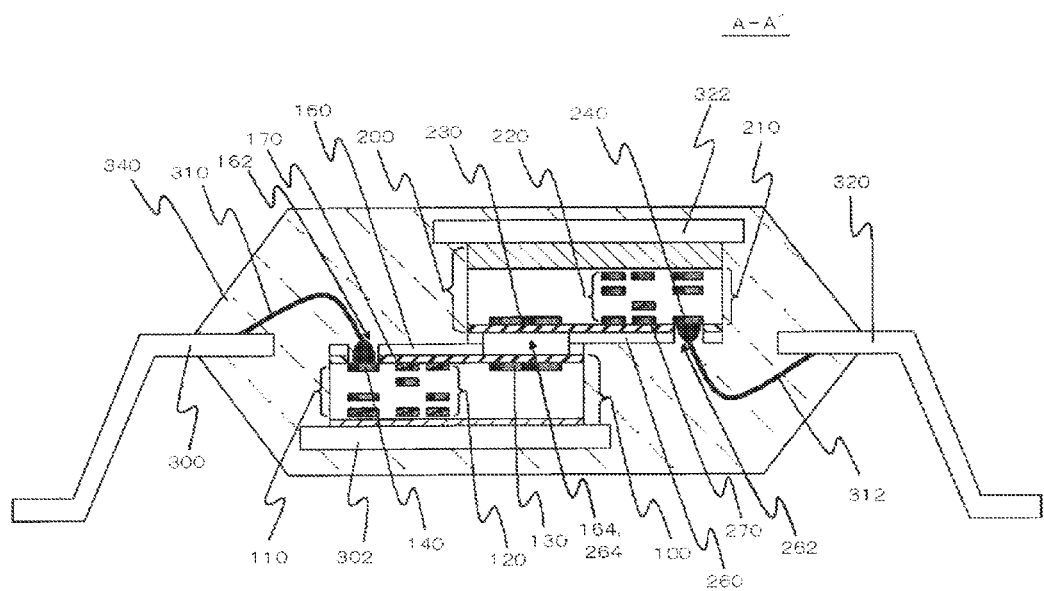
FIG. 14 is a cross-sectional view of a semiconductor device according to a seventh embodiment.

FIG. 14 is a cross-sectional view of a semiconductor device according to a seventh embodiment, and corresponds to FIG. 1 of the first embodiment. The semiconductor device according to the embodiment has the same configuration as the semiconductor device according to the first embodiment, except that the first polyimide layer 160 is not formed in the area located over the first inductor 130, and the second polyimide layer 260 is not formed in the area located over the second inductor 230.

That is, the first polyimide layer 160 has an opening 164 located over the first inductor 130, and the second polyimide layer 260 has an opening 264 located over the second inductor 230. The opening 164 is formed in the same process as the opening 162, and the opening 264 is formed in the same process as the opening 262.

According to the embodiment, the same advantages as the first or second embodiment can be obtained. The first polyimide layer 160 and the second polyimide layer 260 are not formed between the first inductor 130 and the second inductor 230, but the openings are formed. Accordingly, it is possible to reduce a capacitance component generated between the first inductor 130 and the second inductor 230.

In the third to sixth embodiments, the first polyimide layer 160 may be provided with the opening 164 and the second polyimide layer 260 may be provided with the opening 264 as described in the embodiment.

Figure 15:
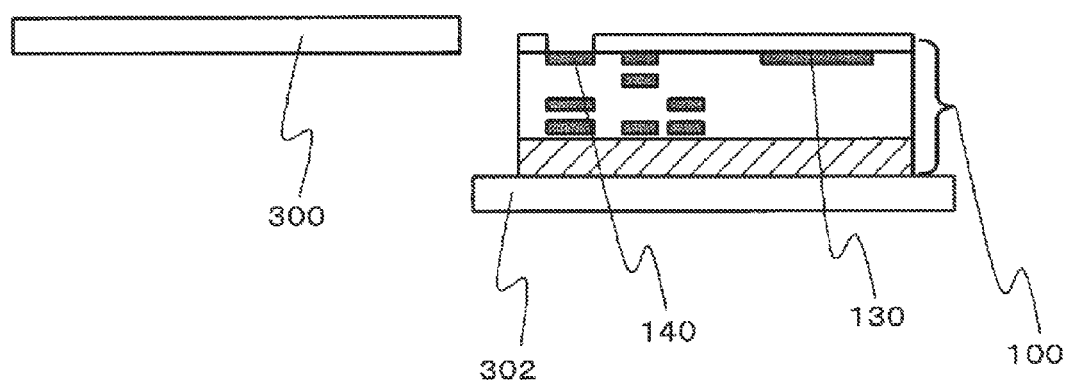
FIG. 15 is a cross-sectional view illustrating a method of manufacturing a semiconductor device according to an eighth embodiment.
Figure 16:
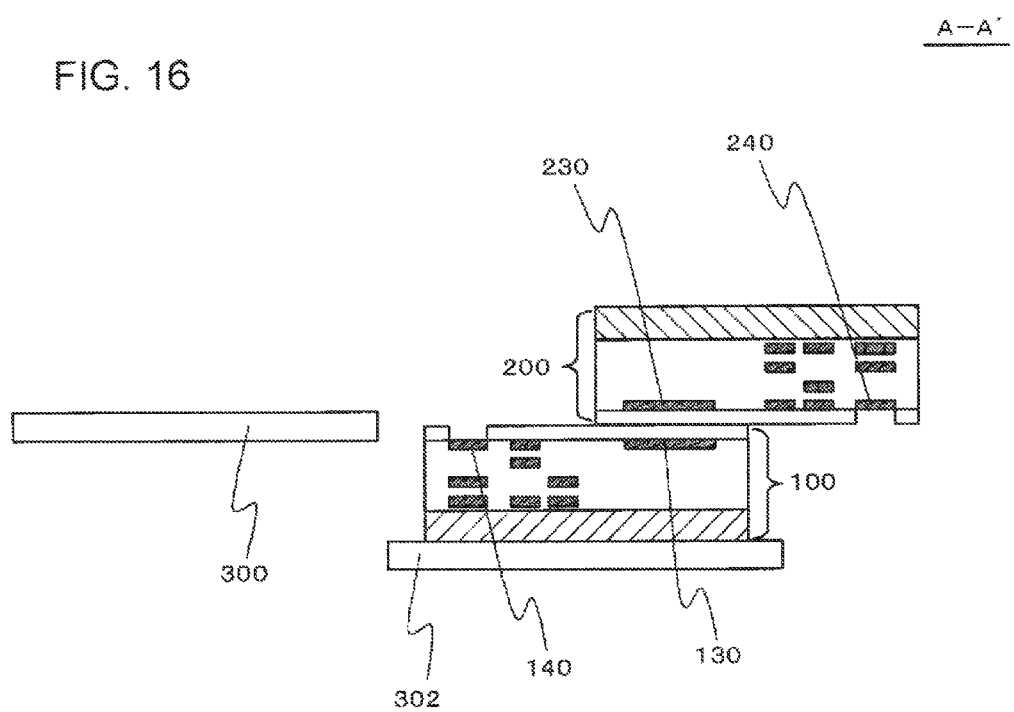
FIG. 16 is a cross-sectional view illustrating a method of manufacturing the semiconductor device according to the eighth embodiment.
Figure 17:
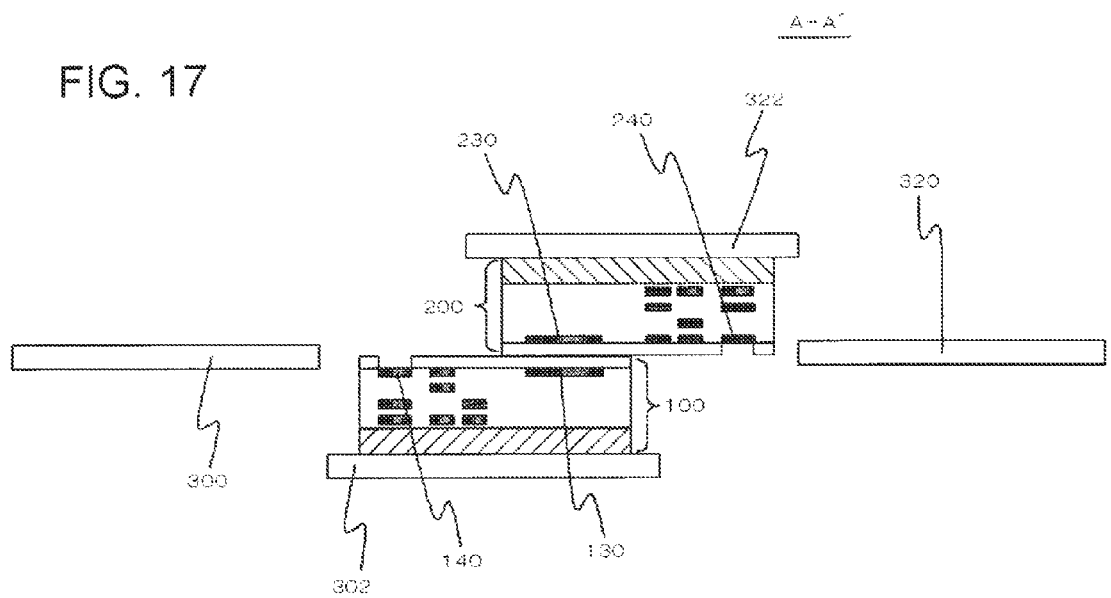
FIG. 17 is a cross-sectional view illustrating a method of manufacturing the semiconductor device according to the eighth embodiment.

FIG. 15 to FIG. 17 are cross-sectional views illustrating a method of manufacturing a semiconductor device according to an eighth embodiment. The method of manufacturing the semiconductor device is the same as the method of manufacturing the semiconductor device according to the first embodiment, except that the second semiconductor chip 200 is provided with the die pad 322 of the second lead frame 320 after the second semiconductor chip 200 is mounted over the first semiconductor chip 100. Hereinafter, the method will be described in detail.

First, as shown in FIG. 15, the first semiconductor chip 100 is fixed to the die pad 302 of the first lead frame 300 using silver paste or the like.

Then, as shown in FIG. 16, the second semiconductor chip 200 is mounted over the first semiconductor chip 100. Specifically, for example, an insulating adhesive layer is formed in the area, where the second semiconductor chip 200, of the surface of the first semiconductor chip 100, and then the second semiconductor chip 200 is mounted over the surface of the first semiconductor chip 100.

At this time, the mounting position of the second semiconductor chip 200 is determined by directly recognizing an external shape of the second semiconductor chip 200 and recognizing an external shape of the die pad 302 of the first lead frame 300 or the first semiconductor chip 100.

In determining the mounting position of the second semiconductor chip 200 with respect to the first semiconductor chip 100, a pattern may be formed to determine the mounting position of the second semiconductor chip 200 on the surface of the first semiconductor chip 100. An alignment mark may be formed on the rear side of the second semiconductor chip 200. After the second semiconductor chip 200 is caught and lifted up by an arm of a mounting device, the pattern on the surface side of the second semiconductor chip 200 is recognized before the second semiconductor device 200 is mounted over the first semiconductor chip 100, thereby recognizing the position of the second semiconductor chip 200.

Then, as shown in FIG. 17, the die pad 322 of the second lead frame 320 is fixed to the second semiconductor chip 200 using silver paste or the like. At this time, the mounting position of the second lead frame 320 is determined on the basis of the position of the first lead frame 300. For example, the mounting position of the second lead frame 320 may be determined on the basis of the pattern of the inner lead pattern or the position of the die pad 302 of the first lead frame 300, and may be determined on the basis of a positioning guide hole formed on the outer line of the first lead frame 300. Accordingly, precision of the relative position of the external lead of the second lead frame 320 with respect to the external lead of the first lead frame 300 becomes high.

Processes thereafter are the same as the first embodiment. When the semiconductor devices according to the second to seventh embodiments are manufactured, the method of manufacturing the semiconductor device according to the embodiment may be applied. However, in the embodiment, the time of providing the first bonding wire 310 may be preferably the time before providing the sealing resin 340 after the first semiconductor chip 100 is mounted over the first lead frame 300, and the time of providing the second bonding wire 312 may be preferably the time before providing the sealing resin 340 after the second lead frame 320 is bonded to the second semiconductor chip 200. For example, the first semiconductor chip 100 is mounted over the first lead frame 300, the second semiconductor chip 200 is mounted over the first semiconductor chip 100, and then the first bonding wire 310 is provided. Thereafter, the laminated body of the first lead frame 300, the first semiconductor chip 100, and the second semiconductor chip 200 are reversed up and down, and then the second bonding wire 312 is provided.

According to the embodiment, the same advantages as the first embodiment can be obtained. In addition, it is possible to determine the relative position of the first semiconductor chip 100 and the second semiconductor chip 200 by directly recognizing the external shape of the second semiconductor chip 200. Accordingly, the precision of the relative position of the first semiconductor chip 100 and the semiconductor chip 200. Particularly, when the relative position of the first semiconductor chip 100 and the second semiconductor chip 200 is determined by recognizing the external shapes of the first semiconductor chip 100 and the second semiconductor chip 200, the precision of the relative position of the first semiconductor chip 100 and the second semiconductor chip 200 becomes particularly high. For this reason, the first inductor 130 and the second inductor 230 can be overlapped with high precision.

Since the second semiconductor chip 200 is provided with the second lead frame 320 after the second semiconductor chip 200 is mounted over the first semiconductor chip 100, the precision of the relative position of the first lead frame 300 and the second lead frame 320 can be raised. That is, any of the installation position of the second lead frame 320 with respect to the first lead frame 300 and the relative position of the first lead frame 300 and the second lead frame 320 can be highly precise.

In the embodiment, the second lead frame 320 may not have the die pad 322. In this case, for example, an external line part of the second lead frame 320 is bonded to an external line part of the first lead frame 300, and thus the second lead frame 320 is supported by the first lead frame 300 before providing the second bonding wire 312. It is preferable to provide the first bonding wire 310 after providing the second bonding wire 312. When the second lead frame 320 is not provided with the die pad 322, a tool (capillary) for providing the first bonding wire 310 does not easily interfere with the second lead frame 320 when providing the first bonding wire 310. Since the second lead frame 320 and the first lead frame 300 can be separated in distance, insulation reliability therebetween can be raised.

In the manufacturing method according to the embodiment, at least one of the first lead frame 300 and the second lead frame 320 may be an interconnect substrate, and at least one of the first semiconductor chip 100 and the second semiconductor chip 200 may be flip-chip-mounted. In this case, the first semiconductor chip 100 and the second semiconductor chip 200 may be fixed to each other in a direction in which the multilayer interconnect layer 110 of the first semiconductor chip 100 and the rear surface of the second semiconductor chip 200 are opposed to each other. The rear surface of the first semiconductor chip 100 and the multilayer interconnect layer 210 of the second semiconductor chip 200 may be fixed to each other. The rear surface of the first semiconductor chip 100 and the rear surface of the second semiconductor chip 200 may be opposed to each other.

Figure 18:
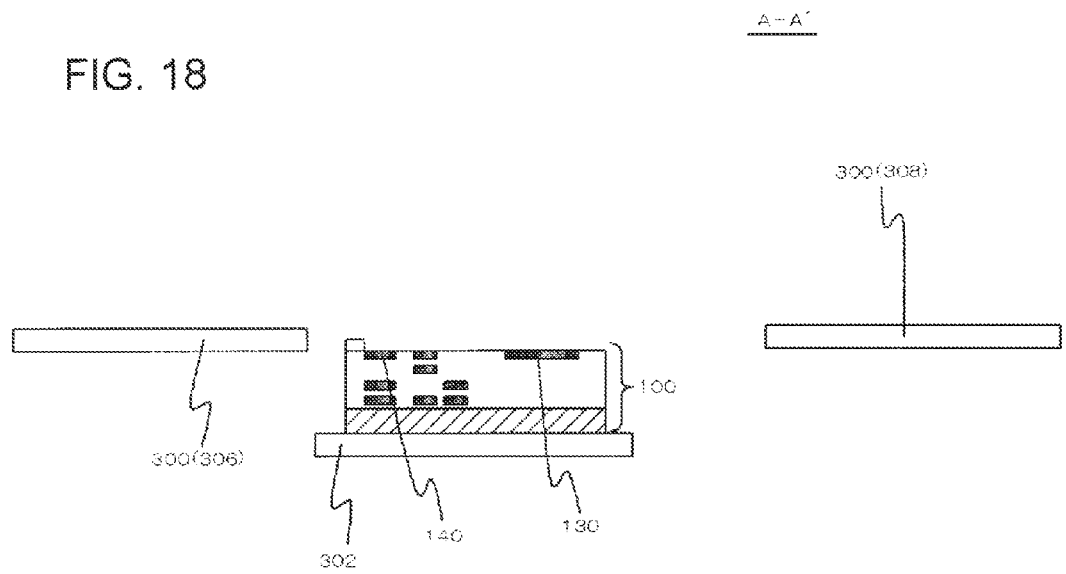
FIG. 18 is a cross-sectional view illustrating a method of manufacturing a semiconductor device according to a ninth embodiment.
Figure 19:
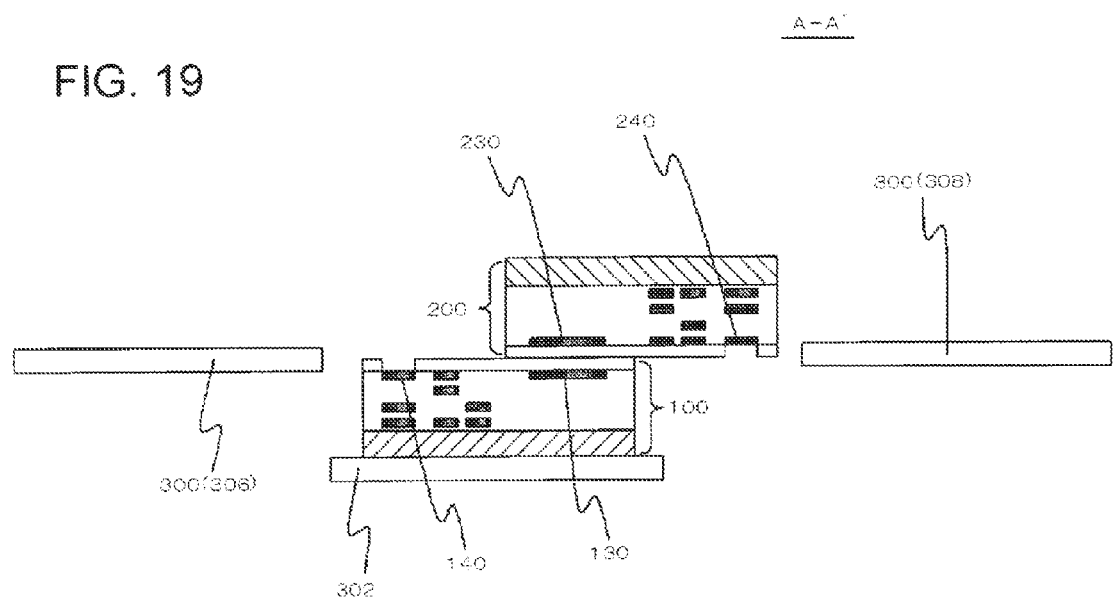
FIG. 19 is a cross-sectional view illustrating a method of manufacturing the semiconductor device according to the ninth embodiment.
Figure 20:
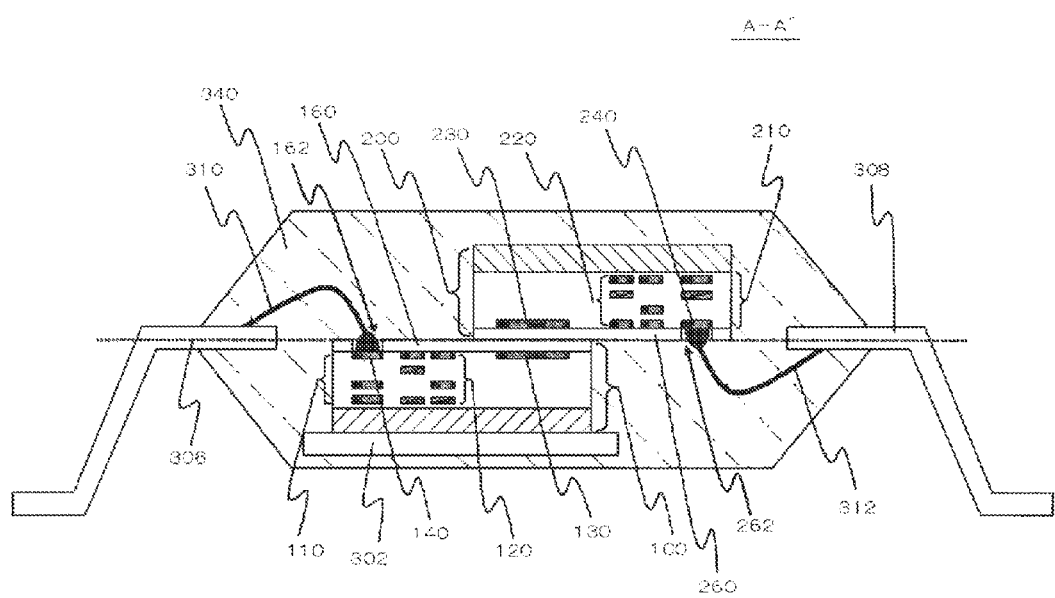
FIG. 20 is a cross-sectional view illustrating a method of manufacturing the semiconductor device according to the ninth embodiment.

FIG. 18 to FIG. 20 are cross-sectional views illustrating a method of manufacturing a semiconductor device according to a ninth embodiment. The method of manufacturing the semiconductor device is the same as the method of manufacturing the semiconductor device according to the eighth embodiment, except that both of the first semiconductor chip 100 and the second semiconductor chip 200 are connected to the first lead frame 300. In the embodiment, the first semiconductor chip 100 has an amount of heat generation larger than that of the second semiconductor chip 200. Hereinafter, it will be described in detail.

First, as shown in FIG. 18, the first semiconductor chip 100 is fixed to the die pad 302 of the first lead frame 300 using silver paste or the like. The first lead frame 300 has a lead 308 connected to the second semiconductor chip 200 in addition to a lead 306 connected to the first semiconductor chip 100. The first lead frame 300 has leads 306 and 308. The lead 306 extends outward from the vicinity of one side of the die pad 302. The lead 308 extends outward from the vicinity of the other side different from the one side of the die pad 302. In the embodiment, the leads 306 and 308 are provided at the position where they are opposed to each other through the die pad 302. A distance from a leading end of an inner lead part of the lead 306 to the die pad 302 is smaller than a distance from a leading end of an inner lead part of the lead 308 to the die pad 302.

Then, as shown in FIG. 19, the second semiconductor chip 200 is mounted over the first semiconductor chip 100. The method of mounting the second semiconductor chip 200 is the same as the eighth embodiment.

Then, as shown in FIG. 20, the first semiconductor chip 100 and the lead 306 are connected to each other by the first bonding wire 310, and the second semiconductor chip 200 and the lead 308 are connected to each other by the second bonding wire 312. Processes thereafter are the same as described in the first embodiment. The leads 306 and 308 can be bent toward the first semiconductor chip 100.

According to the embodiment, the same advantages as the eighth embodiment can be obtained. When providing the bonding wire 312, the bonding wire 312 does not easily interfere with a stage of a bonding device due to the thickness of the die pad 322.

Figure 21:
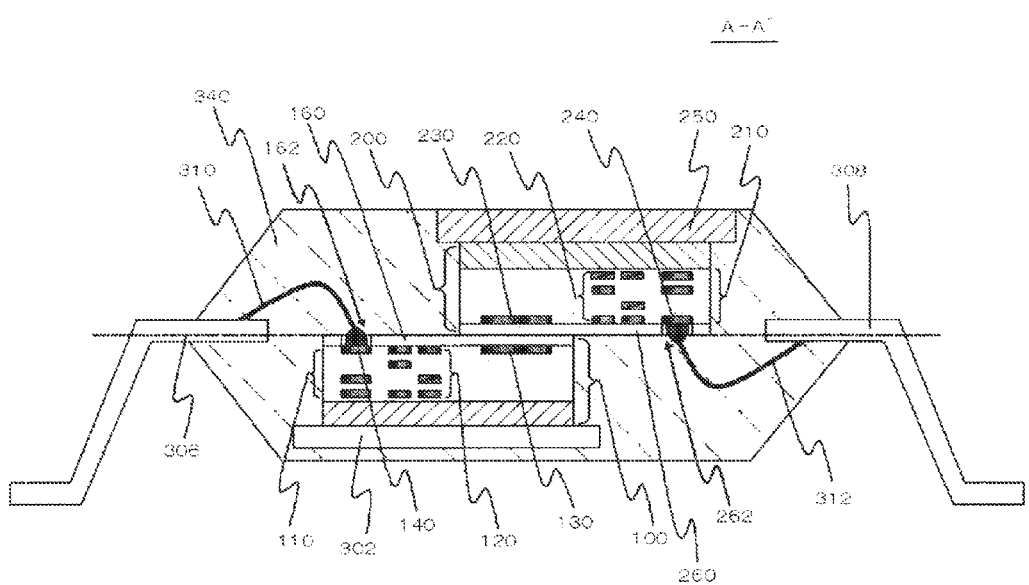
FIG. 21 is a cross-sectional view illustrating a configuration of a semiconductor device according to a tenth embodiment.

FIG. 21 is a cross-sectional view illustrating a configuration of a semiconductor device according to a tenth embodiment. The semiconductor device has the same configuration as the semiconductor device according to the ninth embodiment, except that a protective layer 250 is provided over the rear surface of the second semiconductor chip 200. The protective layer 250 is larger than the second semiconductor chip 200 when seen in a plan view, and covers the entire face of the second semiconductor chip 200.

The protective layer 250 is, for example, a radiant plate, but need not be the radiant plate. The protective layer 250 is, for example, thicker than the die pad 302. The protective layer 250 preferably has a wide area to an extent that does not interfere with the bonding wire 310. After the second semiconductor chip 200 is mounted over the first semiconductor chip 100, the protective layer 250 is mounted over the second semiconductor chip 200 before the sealing resin 340 is formed.

According to the embodiment, the same advantages as the ninth embodiment can be obtained. In addition, it is possible to prevent the second semiconductor chip 200 from being cracked. When the protective layer 250 is thicker than the die pad 302, it is possible to secure a work space when providing the bonding wire 310. When the protective layer 250 is formed of the radiant plate, it is possible to efficiently radiate heat generated from the second semiconductor chip 200.

Figure 22:
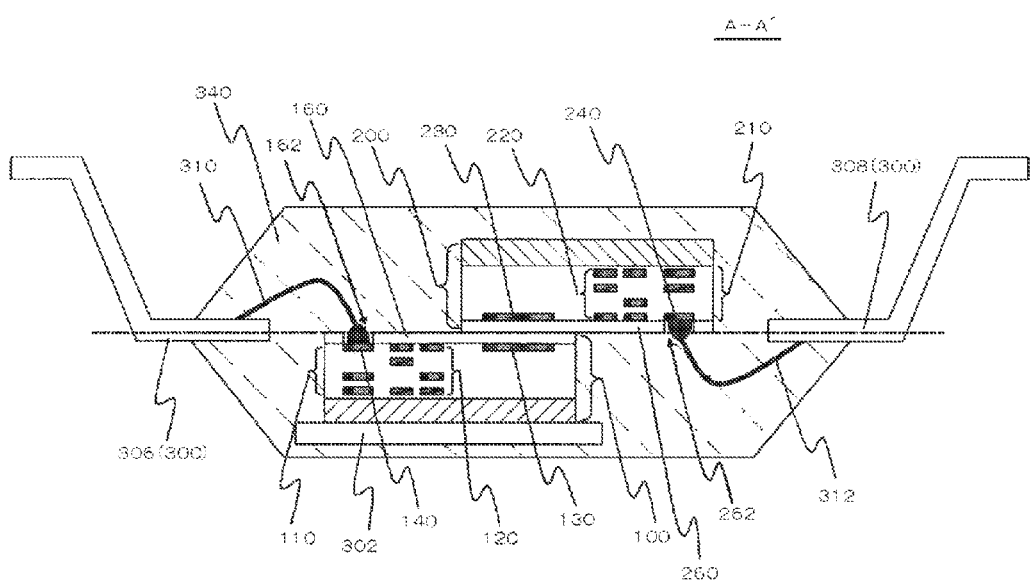
FIG. 22 is a cross-sectional view illustrating a configuration of a semiconductor device according to an eleventh embodiment.

FIG. 22 is a cross-sectional view illustrating a configuration of a semiconductor device according to an eleventh embodiment. The semiconductor device has the same configuration as the semiconductor device according to the ninth embodiment, except that the leads 306 and 308 can be bent toward the second semiconductor chip 200.

According to the embodiment, the same advantages as the ninth embodiment can be obtained. When the semiconductor device shown in FIG. 22 is mounted over a main board or the like, the first semiconductor chip 100 side is upward. For this reason, a heat sink can be mounted on the first semiconductor chip 100 side. Accordingly, it is possible to efficiently radiate heat generated from the first semiconductor chip 100. In the semiconductor device according to the tenth embodiment, the leads 306 and 308 may be bent toward the second semiconductor chip 200 like the embodiment.

Figure 23:
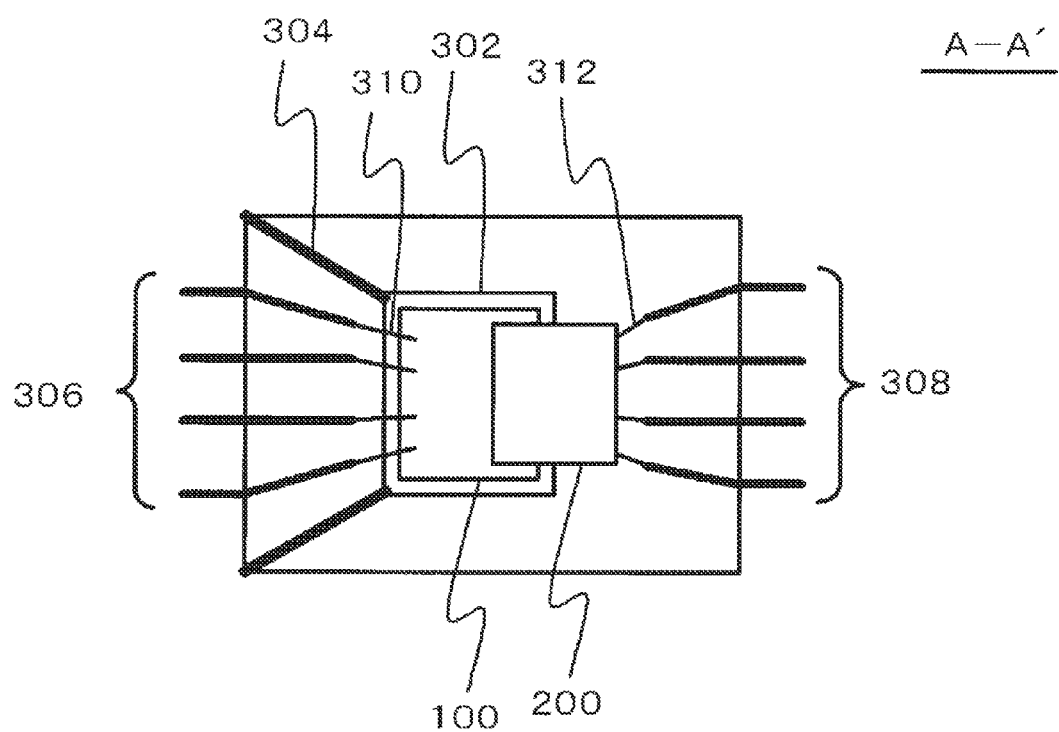
FIG. 23 is a plan view illustrating a configuration of a semiconductor device according to a twelfth embodiment.

FIG. 23 is a plan view for explaining a configuration of a semiconductor device according to a twelfth embodiment. The semiconductor device is provided with suspension leads 304 of the first lead frame 300 at two corners of the die pad 302 opposite to the second semiconductor chip 200, and is provided with no suspension lead at two corners on the second semiconductor chip 200 side. The configuration other than the configuration of the suspension leads is the same as the first to eleventh embodiments.

FIG. 24 is a plan view of a semiconductor device according to a comparative example. The semiconductor device is provided with suspension leads 304 of the first lead frame 300 at four corners of the die pad 302, like a general lead frame.

As shown in FIG. 24, the suspension leads 304 and the leads 308 of the second lead frame 320 are close to each other. A potential of an electric signal input to the first semiconductor chip 100 is different from a potential of an electric signal input to the second semiconductor device 200. Accordingly, when the suspension leads 304 and the leads 308 are close to each other, ion migration occurs between the suspension leads 304 and the leads 308 due to a membrane of water on the package surface or flux at the mounting time, and the insulation of the sealing resin 340 may be broken.

On the contrary, in the embodiment, as shown in FIG. 23, no suspension lead is provided at two corners of the die pad 302 on the semiconductor chip 200 side. For this reason, since the suspension leads 304 and the leads 308 are not close to each other, it is prevented that the ion migration occurs between the suspension leads 304 and the leads 308 to break the insulation of the sealing resin 304.

FIG. 25 is a plan view for explaining a configuration of a semiconductor device according to a thirteenth embodiment. The semiconductor device has the same configuration as the twelfth embodiment, except that suspension leads 305 are provided at two corners of the die pad 302 on the second semiconductor chip 200 side.

The suspension leads 305 extend from the two corners of the die pad 302 on the second semiconductor chip 200 in a direction moving away from any of the bonding wires 312 and the leads 308. That is, the shortest distance between the suspension leads 305 and the leads 308 is a distance from a part of the leads 305 connected to the corners of the die pad 302 to a part of the bonding wire 312 connected to the second semiconductor chip 200.

According to the embodiment, since the suspension leads 305 and the leads 308 are not close to each other, it is prevented that the ion migration occurs between the suspension leads 304 and the leads 308 to break the insulation of the sealing resin 340. Since the suspension leads 305 are provided, it is possible to raise the holding reliability of the die pad 302.

The embodiments of the invention have been described above with reference to the drawings, but they are examples of the invention, and various configurations other than the above configurations may be employed. For example, the first lead frame 300 and the second lead frame 320 may be formed using a ferromagnetic material such as Fe-based or Fe—Ni-based alloy. In this case, it is possible to shield the first semiconductor chip 300 and the second semiconductor chip 320 from external electronic noise by the first lead frame 300 and the second lead frame 320. In order to raise the strength of the first lead frame 300 and the second lead frame 320, it is possible to suppress positional difference or deformation of the die pad, for example, with respect to the structures shown in FIG. 23 and FIG. 25, that is, the structure in which the positions of the suspension leads are loosened.

The first lead frame 300 and the second lead frame 320 may be formed of material different from each other. For example, the lead frame for mounting the semiconductor chip with a relatively large amplitude voltage, a high referential voltages, or a large amount of heat generation may be formed of a Cu alloy material, and the lead frame for mounting the other semiconductor chip may be formed of Fe-based alloy with an advantage in deformation strength or long-time connection reliability.

Pitches of the lead terminal parts of the first lead frame 300 and the second lead frame 320 may be different from each other.

According to the embodiments shown in FIG. 15 to FIG. 17, the following invention is disclosed.

(Addition 1)

A method of manufacturing a semiconductor device including:

fixing a rear surface of a first semiconductor chip having a first multilayer interconnect layer, a first inductor formed in the first multilayer interconnect layer, and a first external connection terminal formed in the first multilayer interconnect layer, to a first lead frame or a first interconnect substrate;

positioning and fixing a second semiconductor chip having a second multilayer interconnect layer, a second inductor formed in the second multilayer interconnect layer, and a second external connection terminal formed in the second multilayer interconnect layer, with respect to the first semiconductor chip, to overlap the first inductor and the second inductor with each other when seen in a plan view; and positioning the second lead frame with respect to the first lead frame or the first interconnect substrate, and then fixing the second lead frame to the second semiconductor chip.

According to the embodiment of the invention, the position of the second semiconductor chip is directly determined with respect to the first semiconductor chip, and the position of the second lead frame with respect to the first lead frame or the first interconnect substrate can be directly determined. Accordingly, both of the relative position of the first semiconductor chip and the second semiconductor chip, and the relative position of the first lead frame or the first interconnection substrate and the second lead frame can be highly reliable.

It is apparent that the present invention is not limited to the above embodiments, but may be modified and changed without departing from the scope and spirit of the invention.

What is claimed is:

1. A semiconductor device comprising:
    a chip mounting portion comprising a first upper surface that is an upper surface of the chip mounting portion and a first lower surface that is a lower surface of the chip mounting portion opposite to the first upper surface;
    a first chip comprising a first multilayer interconnect layer and a first inductor formed in the first multilayer interconnect layer; and
    a second chip comprising a second multilayer interconnect layer and a second inductor formed in the second multilayer interconnect layer,
    wherein the first chip comprises a rectangular first front surface comprising a first terminal formed thereon and a first back surface opposite to the first front surface, wherein the first chip is mounted over the chip mounting portion such that the first upper surface of the chip mounting portion is faced with the first back surface of the first chip,
    wherein the second chip comprises a rectangular second front surface comprising a second terminal formed thereon and a second back surface opposite to the second front surface, wherein the second chip is mounted over the first chip such that the first front surface of the first chip is faced with the second front surface of the second chip,
    wherein the first inductor and the second inductor are disposed such that the first inductor and the second inductor are overlapped with each other as viewed from a direction perpendicular to the first upper surface of the chip mounting portion, and
    wherein the second front surface of the second chip comprises an extension region that does not overlap with the first upper surface of the chip mounting portion as viewed from a direction perpendicular to the first upper surface of the chip mounting portion.

2. The semiconductor device as set forth in claim 1,
    wherein the first chip comprises a first side surface between the first front surface and the first back surface,
    wherein the second chip comprises a second side surface between the second front surface and the second back surface, wherein the chip mounting portion comprises a third side surface between the first upper surface and the first lower surface, the semiconductor device further comprising sealing resin sealing the first side surface of the first chip, the second side surface of the second chip and the third side surface of the chip mounting portion.

3. The semiconductor device as set forth in claim 2, further comprising a plurality of leads comprising a first lead and a second lead, wherein the first lead comprises a first end that is one end of the first lead disposed in the sealing resin and a second end that is the other end of the first lead extending outside from the sealing resin while the second lead comprises a third end that is one end of the second lead disposed in the sealing resin and a fourth end that is the other end of the second lead extending outside from the sealing resin, the semiconductor device further comprising a first wire through which the first end of the first lead and the first terminal are connected and a second wire through which the third end of the second lead and the second terminal are connected.

4. The semiconductor device as set forth in claim 3, wherein the first upper surface of the chip mounting portion comprises a first side and a second side faced with the first lead and the second lead respectively as viewed from a direction perpendicular to the first upper surface of the chip mounting portion, wherein a distance between the first lead and the first side is less than a distance between the second lead and the second side.

5. The semiconductor device as set forth in claim 3, wherein the first end of the first lead comprises a second upper surface that is an upper surface of the first end of the first lead and a second lower surface that is a lower surface of the first end of the first lead opposite to the second upper surface, wherein a distance between the second upper surface of the first lead and the first lower surface of the chip mounting portion is greater than a distance between the second lower surface of the first lead and the first lower surface of the chip mounting portion, wherein the third end of the second lead comprises a third upper surface that is an upper surface of the third end of the second lead and a third lower surface that is a lower surface of the third end of the second lead opposite to the third upper surface, wherein a distance between the third upper surface of the second lead and the first lower surface of the chip mounting portion is greater than a distance between the third lower surface of the second lead and the first lower surface of the chip mounting portion, and wherein the first wire is connected to the second upper surface of the first end of the first lead while the second wire is connected to the third lower surface of the third end of the second lead.

6. The semiconductor device as set forth in claim 5, wherein a distance between a plane comprising the first upper surface of the chip mounting portion and the second front surface of the second chip is greater than a distance between a plane comprising the first upper surface of the chip mounting portion and the third lower surface of the third end of the second lead.

7. The semiconductor device as set forth in claim 1, wherein the first chip comprises at least one of a transmission circuit and a reception circuit connected to the first inductor while the second chip comprises the other of a transmission circuit and a reception circuit connected to the second inductor.

8. The semiconductor device as set forth in claim 1, wherein the first inductor and the second inductor transmit or send an electric signal using induction coupling.

9. The semiconductor device as set forth in claim 7, wherein the first chip comprises a substrate, wherein the transmission circuit or the reception circuit comprises a transistor formed in the substrate.

10. The semiconductor device as set forth in claim 1, wherein a potential amplitude of an electric signal input into the first chip and a potential amplitude of an electric signal input into the second chip are different from each other.

11. The semiconductor device as set forth in claim 1, wherein a referential potential of an electric signal input into the first chip and a referential potential of an electric signal input into the second chip are different from each other.

12. The semiconductor device as set forth in claim 1, further comprising an insulating layer formed between the first front surface of the first chip and the second front surface of the second chip.

13. The semiconductor device as set forth in claim 12, further comprising a sealing resin sealing the first chip and the second chip, wherein a part of the first front surface of the first chip is covered by the insulating layer whereas the other part of the first front surface of the first chip is covered by the sealing resin.

14. The semiconductor device as set forth in claim 12, wherein the insulating layer has a thickness equal to or more than 10 μm and equal to or less than 100 μm.

15. The semiconductor device as set forth in claim 12, wherein the first chip further comprises a first insulating film formed between the insulating layer and the first inductor, and wherein the second chip further comprises a second insulating film formed between the insulating layer and the second inductor.

16. The semiconductor device as set forth in claim 15, wherein the first insulating film and the second insulating film comprise a polyimide, wherein the first chip further comprises a third insulating film comprising silicon and formed between the first insulating film and the first inductor, and wherein the second chip further comprises a fourth insulating film comprising silicon and formed between the second insulating film and the second inductor.

17. The semiconductor device as set forth in claim 1, further comprising:

a sealing resin sealing the first chip and the second chip; and a plurality of leads comprising a first lead and a second lead, wherein the first lead comprises a first end that is one end of the first lead disposed in the sealing resin and a second end that is the other end of the first lead extending outside from the sealing resin while the second lead comprises a third end that is one end of the second lead disposed in the sealing resin and a fourth end that is the other end of the second lead extending outside from the sealing resin, the semiconductor device further comprising a first wire through which the first end of the first lead and the first terminal are connected and a second wire through which the third end of the second lead and the second terminal are connected, wherein the sealing resin, when viewed from a direction perpendicular to the first upper surface of the chip mounting portion, comprises a first sealing resin side, a second sealing resin side opposite to the first sealing resin side, a third sealing resin side between the first sealing resin side and the second sealing resin side and a fourth sealing resin side opposite to the third sealing resin side, and wherein the first lead crosses the first sealing resin side while the second lead crosses the second sealing resin side.

18. The semiconductor device as set forth in claim 17, wherein the second end of the first lead and the fourth end of the second lead are bent away from the first upper surface of the chip mounting potion.

19. The semiconductor device as set forth in claim 17, comprising no lead comprising one end formed in the sealing resin and the other end extending outside from the sealing resin and crossing the third sealing resin side or the fourth sealing resin side.

20. The semiconductor device as set forth in claim 19, further comprising a suspension lead extending between the chip mounting portion and any side of the sealing resin, wherein the suspension lead is formed between the chip mounting portion and at least any side of the first sealing resin side, the third resin sealing side and the fourth resin sealing side, and is not formed between the mounting portion and the second resin sealing side.

* * * * *